United States Patent
Chu et al.

(10) Patent No.: US 11,393,718 B2
(45) Date of Patent: Jul. 19, 2022

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Hwei-Jay Chu, Hsinchu (TW); Chieh-Han Wu, Kaohsiung (TW); Cheng-Hsiung Tsai, Zhunan Township, Miaoli County (TW); Chih-Wei Lu, Hsinchu (TW); Chung-Ju Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 35 days.

(21) Appl. No.: 16/943,815

(22) Filed: Jul. 30, 2020

(65) Prior Publication Data
US 2021/0242078 A1   Aug. 5, 2021

Related U.S. Application Data

(60) Provisional application No. 62/967,730, filed on Jan. 30, 2020.

(51) Int. Cl.
| | |
|---|---|
| *H01L 21/768* | (2006.01) |
| *H01L 23/528* | (2006.01) |
| *H01L 23/522* | (2006.01) |
| *H01L 29/66* | (2006.01) |
| *H01L 29/78* | (2006.01) |

(52) U.S. Cl.
CPC .. *H01L 21/76831* (2013.01); *H01L 21/76816* (2013.01); *H01L 21/76877* (2013.01); *H01L 21/76897* (2013.01); *H01L 23/5226* (2013.01); *H01L 23/5283* (2013.01); *H01L 29/66795* (2013.01); *H01L 29/785* (2013.01)

(58) Field of Classification Search
CPC ......... H01L 21/76897; H01L 21/76831; H01L 21/76816; H01L 21/76877; H01L 29/66734; H01L 29/66795; H01L 23/5226
See application file for complete search history.

(56) References Cited

U.S. PATENT DOCUMENTS

| | | | | |
|---|---|---|---|---|
| 8,062,966 | B2 * | 11/2011 | Mehrad | H01L 21/823842 438/188 |
| 2012/0086048 | A1 * | 4/2012 | Park | H01L 29/7843 257/288 |

(Continued)

*Primary Examiner* — Jaehwan Oh
*Assistant Examiner* — John M Parker
(74) *Attorney, Agent, or Firm* — Birch, Stewart, Kolasch & Birch, LLP

(57) ABSTRACT

A method for forming a semiconductor structure includes forming a first cap layer over a metal layer. The method also includes patterning the metal layer and the first cap layer to form openings exposing the gate structure, and forming a first dielectric layer in the openings, and patterning the first cap layer to form a via cap plug over the metal layer. The method also includes forming a second dielectric layer over the via cap plug and the metal layer, and forming a trench in the second dielectric material to expose the via cap plug. The method also includes removing the via cap plug to enlarge the trench and filling the trench with a conductive material.

20 Claims, 24 Drawing Sheets

(56) References Cited

U.S. PATENT DOCUMENTS

| | | | | |
|---|---|---|---|---|
| 2013/0009257 A1* | 1/2013 | Ando | ................ | H01L 21/28176 |
| | | | | 257/E21.409 |
| 2013/0240990 A1* | 9/2013 | Yin | .................. | H01L 29/41783 |
| | | | | 438/300 |
| 2013/0309852 A1* | 11/2013 | Kanakasabapathy | ........................ | |
| | | | | H01L 21/76897 |
| | | | | 438/585 |
| 2014/0027822 A1* | 1/2014 | Su | ..................... | H01L 23/53238 |
| | | | | 438/653 |
| 2018/0286957 A1* | 10/2018 | Bae | ..................... | H01L 27/0924 |
| 2019/0164813 A1* | 5/2019 | Wang | ................ | H01L 21/76877 |
| 2021/0265202 A1* | 8/2021 | Wang | ................ | H01L 21/76895 |

* cited by examiner

SEMICONDUCTOR STRUCTURE AND METHOD FOR FORMING THE SAME

CROSS REFERENCE TO RELATED APPLICATIONS

This application claims the benefit of U.S. Provisional Application No. 62/967,730, filed on Jan. 30, 2020, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A, 2B, 2C-1, 2D-1, 2E-1, 2F, 2G, 2H, 2I are cross-sectional representations of various stages of forming a semiconductor structure, in accordance with some embodiments of the disclosure.

FIGS. 2C-2, 2D-2, 2E-2 are top views of various stages of forming a semiconductor structure, in accordance with some embodiments of the disclosure.

FIGS. 3A-1, 3B-1, 3C are cross-sectional representations of various stages of forming a modified semiconductor structure, in accordance with some embodiments of the disclosure.

FIGS. 3A-2 and 3B-2 are top views of various stages of forming a modified semiconductor structure, in accordance with some embodiments of the disclosure.

FIGS. 4A-1, 4B-1, 4C are cross-sectional representations of various stages of forming a modified semiconductor structure, in accordance with some embodiments of the disclosure.

FIGS. 4A-2 and 4B-2 are top views of various stages of forming a modified semiconductor structure, in accordance with some embodiments of the disclosure.

DETAILED DESCRIPTION

Figure 1:
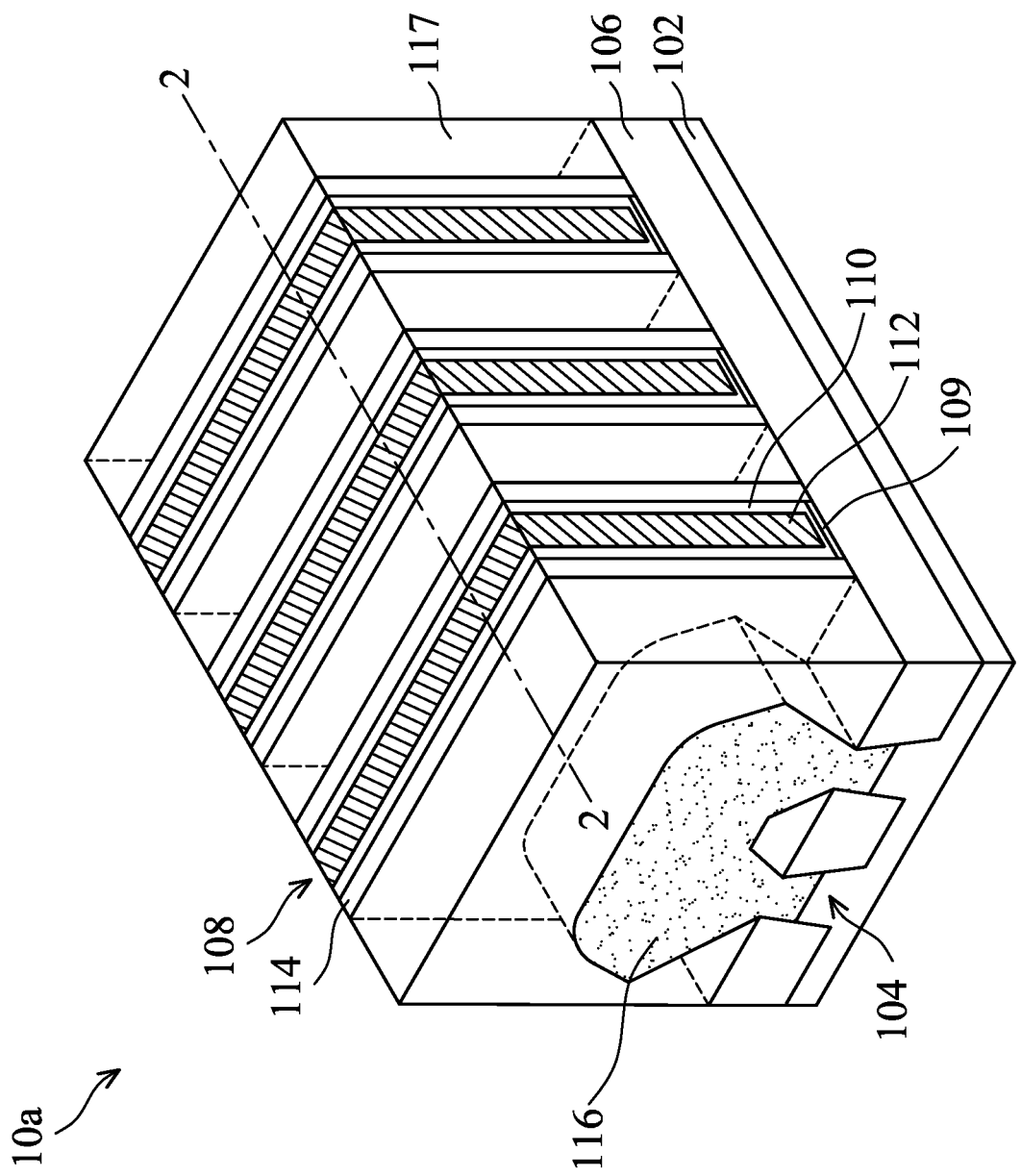
FIG. 1 is a perspective representation of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include forming a via cap plug before forming the via structure and the metal layer above the via structure, allowing the via structure to be self-aligned and thereby avoiding any issues with overlay shift. The via structure may be well-controlled by the via plug, avoiding the loading effect. Moreover, without an etch stop layer below the via structure, the capacitance may be reduced.

FIG. 1 is a perspective representation of a semiconductor structure 10a, in accordance with some embodiments of the disclosure. FIGS. 2A, 2B, 2C-1, 2D-1, 2E-1, 2F, 2G, 2H, 2I are cross-sectional representations of various stages of forming a semiconductor structure 10a, in accordance with some embodiments of the disclosure. FIGS. 2A, 2B, 2C-1, 2D-1, 2E-1, 2F, 2G, 2H, 2I show cross-sectional representations taken along line 2-2 in FIG. 1.

Figure 2A:
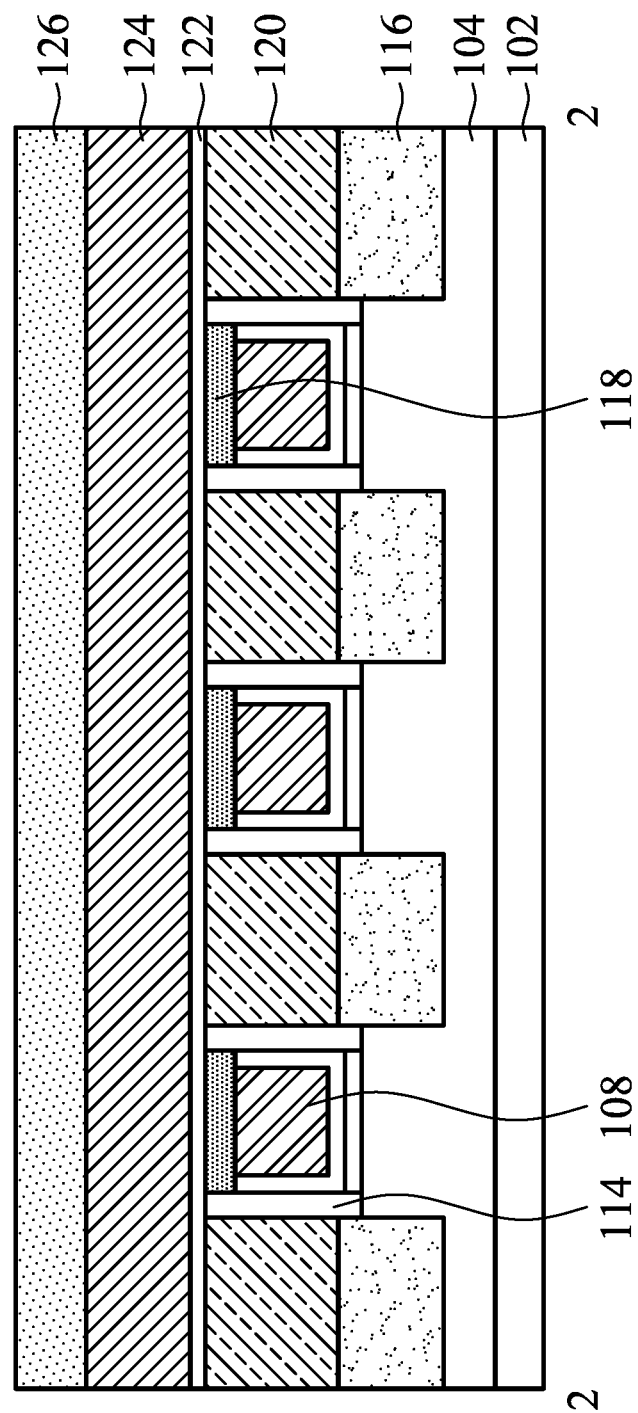

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments, In some embodiments, the isolation layer 106 is made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1 and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIGS. 1 and 2A in accordance with some embodiments. In some embodiments, the gate structure 108 includes an interfacial layer 109, a gate dielectric layer 110 and a gate electrode layer 112. In some embodiments, the gate dielectric layer 110 is a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

The interfacial layer 109 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. In some embodiments, the interfacial layer 109 may be thermally grown using a thermal oxidation process in oxygen-containing ambient or nitrogen-containing ambient (e.g. NO or $N_2O$).

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide (HfO$_2$). Alternatively, the high-k dielectric layer may include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfTiO, LaSiO, AlSiO, (Ba, Sr)TiO$_3$, Al$_2$O$_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as SF$_6$, C$_x$F$_y$, (where x and y may be positive integers), NF$_3$, or a combination thereof. After the etching process, the top portion of the fin structure 104 may be exposed on opposite sides of the gate structure 108.

Next, a pair of spacers 114 are formed on opposite sidewalls of the gate structure 108, as shown in FIGS. 1 and 2A in accordance with some embodiments. The spacers 114 may be made of silicon oxide, silicon nitride, silicon oxynitride, and/or dielectric materials. The spacers 114 may be formed by a chemical vapor deposition (CVD) process, a spin-on-glass process, or another applicable process.

Afterwards, the top portion of the fin structure 104 exposed on opposite sides of the gate structure 108 may be removed in an etching process to form a recess (not shown). The etching process may be a dry etching process or a wet etching process. The fin structures 104 may be etched by a dry etching process. The dry etching process may include using a fluorine-based etchant gas, such as SF$_6$, C$_x$F$_y$, (where x and y may be positive integers), NF$_3$, or a combination thereof.

Next, a source/drain epitaxial structure 116 is formed in the recess over the fin structure 104 on opposite sides of the gate structure 108, as shown in FIGS. 1 and 2A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 116 is formed, a first inter-layer dielectric (ILD) structure 117 is formed to cover the source/drain epitaxial structure 116, as shown in FIG. 1 in accordance with some embodiments. In some embodiments, the first ILD structure 117 surrounds the fin structure 104 and the source/drain epitaxial structure 116.

The first ILD structure 117 may include multilayers made of multiple dielectric materials, such as silicon oxide (SiO$_x$, where x may be a positive integer), silicon oxycarbide (SiCO$_y$, where y may be a positive integer), silicon oxycarbonitride (SiNCO$_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 117 may be formed by chemical vapor deposition (CVD), spin-on coating, or other applicable processes.

Afterwards, a planarizing process is performed on the first ILD structure 117 until the top surface of the gate structure 108 is exposed, as shown in FIG. 1 in accordance with some embodiments. After the planarizing process, the top surface of the gate structure 108 may be substantially level with the top surfaces of the spacers 114 and the first ILD structure 117. The planarizing process may include a grinding process, a chemical mechanical polishing (CMP) process, an etching process, other applicable processes, or a combination thereof.

Next, the gate structure 108 is recessed to form a recess (not shown). The recessing process may include one or more etching processes, such as dry etching and/or wet etching.

Next, a gate cap layer 118 is formed in the recess above the gate structure 108, as shown in FIG. 2A in accordance with some embodiments. The gate cap layer 118 may provide isolation for subsequently formed contact structure and conductive elements nearby. The gate cap layer 118 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The gate cap layer 118 may be deposited in the trench by CVD (such as HDP-CVD, PECVD, or HARP), ALD, another suitable method, and/or a combination thereof. After the gate cap layer 118 is deposited, a planarization process (e.g., a chemical mechanical polishing process or an etching back process) may optionally be performed to remove excess dielectric materials.

Afterwards, a patterning and an etching process are performed to form a hole in the first ILD structure 117 by using a patterned photoresist layer as a mask (not shown). The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 116 may be exposed from the hole.

Next, a metal semiconductor compound layer may be formed over the source/drain epitaxial structure 116 (now shown). The metal semiconductor compound layer may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source/drain epitaxial structure 116 by forming a metal layer over the source/drain epitaxial structure 116 first. The metal layer may react with the source/drain epitaxial structure 116 in an annealing process and a metal semiconductor compound layer may be produced. Afterwards, the unreacted metal layer may be removed in an etching process and the metal semiconductor compound layer may be left.

Afterwards, a contact structure 120 is formed into the trench over the source/drain epitaxial structure 116, as shown in FIG. 2A in accordance with some embodiments. The contact structure 120 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 120 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 120, and then a planarization process such as a chemical mechanical polishing (CMP) process or an etch back process is optionally performed to remove excess conductive materials. After the planarization process, the top surface of the contact structure 120 may be level with the top surface of the gate cap layer 118 and the top surface of the first ILD structure 117.

Next, a glue layer 122 is deposited over the gate structure 108 and the contact structure 120, as shown in FIG. 2A in accordance with some embodiments. The glue layer 122 may provide better adhesion between different materials of the gate structure 108, the contact structure 120, and subsequently formed metal layer over the glue layer 122. The glue layer 122 may include Si, SiO, SiN, SiCN, SiON, SiOC, metal nitrides such as titanium nitrides, metals, other applicable materials, or a combination thereof. The glue layer 122 may be formed by chemical vapor deposition process (CVD), a physical vapor deposition process (PVD), (e.g., evaporation or sputter), an atomic layer deposition process (ALD), an electroplating process, other suitable processes, or a combination thereof to blanketly deposit the glue layer material over the gate structure 108 and the contact structure 120. In some embodiments, as shown in FIG. 2A, the glue layer 122 has a thickness in a range of about 5 Å to about 200 Å. If the glue layer 122 is too thick, the electric performance may be worse. If the glue layer 122 is too thin, the glue layer 122 may be discontinuous.

Then, a metal layer 124 is formed over the glue layer 122, as shown in FIG. 2A in accordance with some embodiments. The metal layer 124 may include Ta, TaN, TiN, Cu, Co, W, Ru, Al, Mo, Ir, other applicable metallic materials, an alloy thereof, or a combination thereof. The metal layer 124 may include a stacked structure of TiN/AlCu/TiN. A blanket metal layer 124 may be formed over the glue layer 122 by a physical vapor deposition process (e.g., evaporation or sputtering), an atomic layer deposition process (ALD), an electroplating process, other applicable processes or a combination thereof.

Next, a first cap layer 126 is formed over the metal layer 124, as shown in FIG. 2A in accordance with some embodiments. The first cap layer 126 may be a hard mask for subsequently etching of the metal layer 124. The first cap layer 126 may include Si, SiO, SiN, SiCN, SiON, SiOC, metal nitrides, metal carbide, metal oxide, metals, other applicable materials, or a combination thereof. The first cap layer 126 may be formed by chemical vapor deposition process (CVD), a physical vapor deposition process (PVD), (e.g., evaporation or sputter), an atomic layer deposition process (ALD), an electroplating process, other suitable processes, or a combination thereof to blanketly deposit a first cap layer 126 over the metal layer 124. In some embodiments, as shown in FIG. 2A, the first cap layer 126 has a thickness in a range of about 30 Å to about 1000 Å. If the first cap layer 126 is too thick, the aspect ratio of subsequently etching may be too high, and the metal layer 124 after etching may collapse. If the first cap layer 126 is too thin, the metal layer 124 beneath the first cap layer 126 is not well-defined in subsequently etching, and the profile of the metal layer 124 after etching may not be straight.

Next, the first cap layer 126 and the metal layer 124 are patterned to form openings exposing the gate structure 108 (not shown). In some embodiments, the glue layer 122 exposed in the opening is also removed during the patterning process so that the gate structure 108 is exposed in the opening. The patterning process may include a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

In some embodiments, the first cap layer 126 and the metal layer 124 is etched by a reactive-ion etching (RIE). The RIE process may use etchers such as inductively coupled plasma (ICP), capacitively coupled plasma (CCP), remote plasma, other applicable etchers, or a combination thereof. The etching gas may include $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, other applicable gases, or a combination thereof. The RIE process may be performed under a pressure in a range of about 0.2 mT to about 120 mT. The RIE process may be performed under a temperature in a range of about 0° C. to about 200° C. The RIE process may be performed with a power in a range of about 50 W to about 3000 W, and with a bias in a range of about 0V to about 1200V. If the pressure, the temperature, the power, and the bias of the RIE process are too high or too low, it may reach the chamber limitation. In addition, the profile of the metal layer 124 may be worse and may cause damage. The RIE process may also be include a wet clean removal process.

Figure 2B:
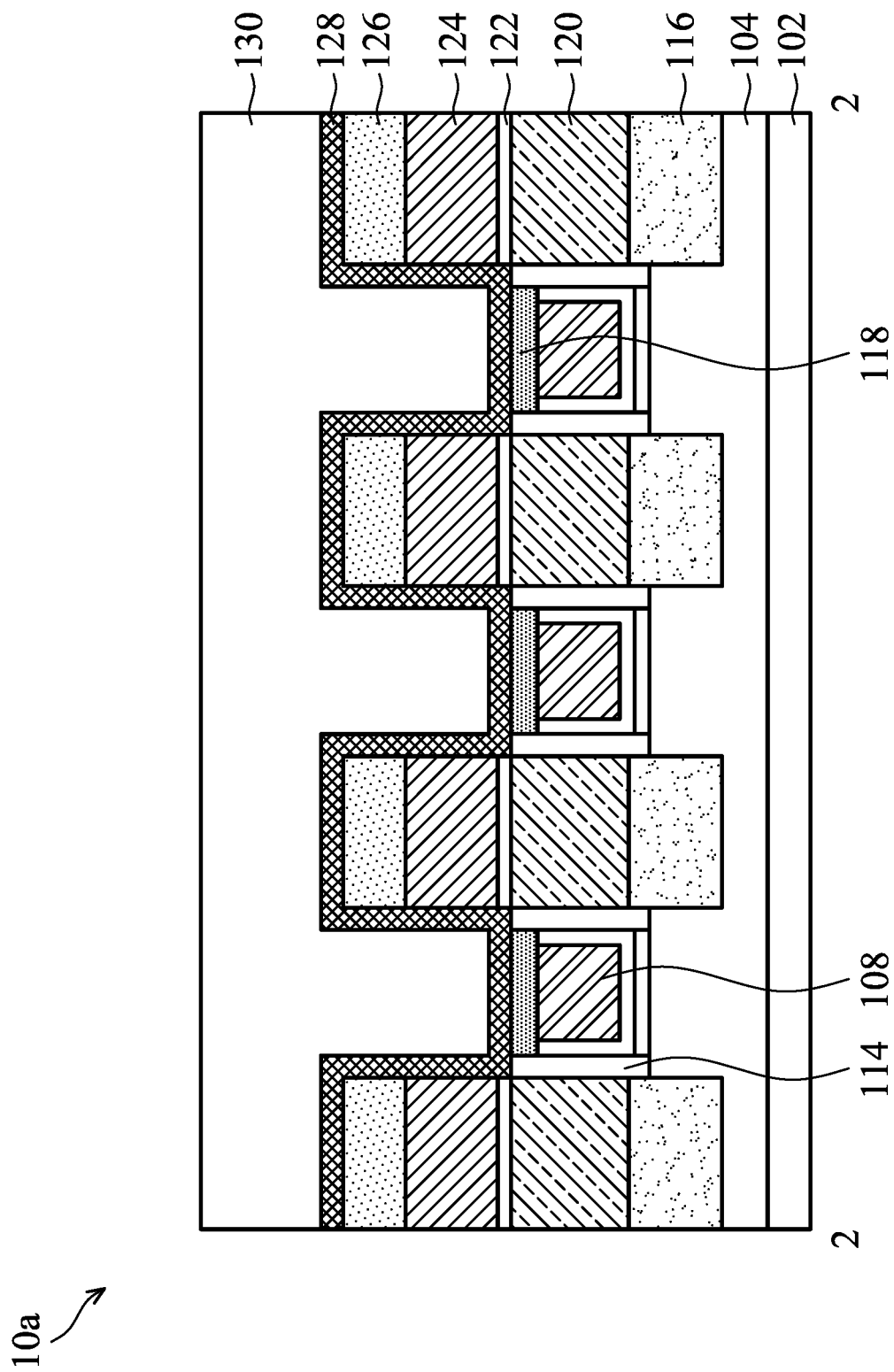

Next, a protection layer 128 is conformally formed over the first cap layer 126, the metal layer 124, and the gate structure 108, as shown in FIG. 2B in accordance with some embodiments. The protection layer 128 may protect the metal layer 124 during subsequent processes. The protection layer 128 may include Si, SiO, SiN, SiC, SiON, SiOC, metal nitrides, metal oxides, other applicable materials, or a combination thereof. The protection layer 128 may be formed by a chemical vapor deposition process (CVD), a physical vapor deposition process (PVD), (e.g., evaporation or sputter), an atomic layer deposition process (ALD), an electroplating process, other suitable processes, or a combination thereof. In some embodiments, as shown in FIG. 2B, the protection layer 128 has a thickness in a range of about 5 Å to about 200 Å. If the protection layer 128 is too thick, it may fill up the opening or the capacitance may increase. If the protection layer 128 is too thin, the metal layer 124 may not be well protected.

Afterwards, a first dielectric layer 130 is filled in the openings in the first cap layer 126 and the metal layer 124, as shown in FIG. 2B in accordance with some embodiments. The first dielectric layer 130 may include SiC, $SiO_2$, SiOC, SiN, SiCN, SiON, SiOCN, other applicable materials, or a combination thereof. The first dielectric layer 130 may be formed by a spin-on coating process, a chemical vapor deposition process, an atomic layer deposition process, a physical vapor deposition process, other applicable processes, or a combination thereof. In some embodiments, as shown in FIG. 2B, the first dielectric layer 130 has a thickness in a range of about 30 Å to about 3000 Å. If the first dielectric layer 130 is too thick, it may cost too much in the subsequently planarization process. If the first dielectric layer 130 is too thin, it may not fill the opening in the first cap layer 126 and the metal layer 124 completely.

In some embodiments, as shown in FIG. 2B, after filling the first dielectric layer 130, the protection layer 128 is between the gate structure 108 and the first dielectric layer 130.

Figures 1, 2C:
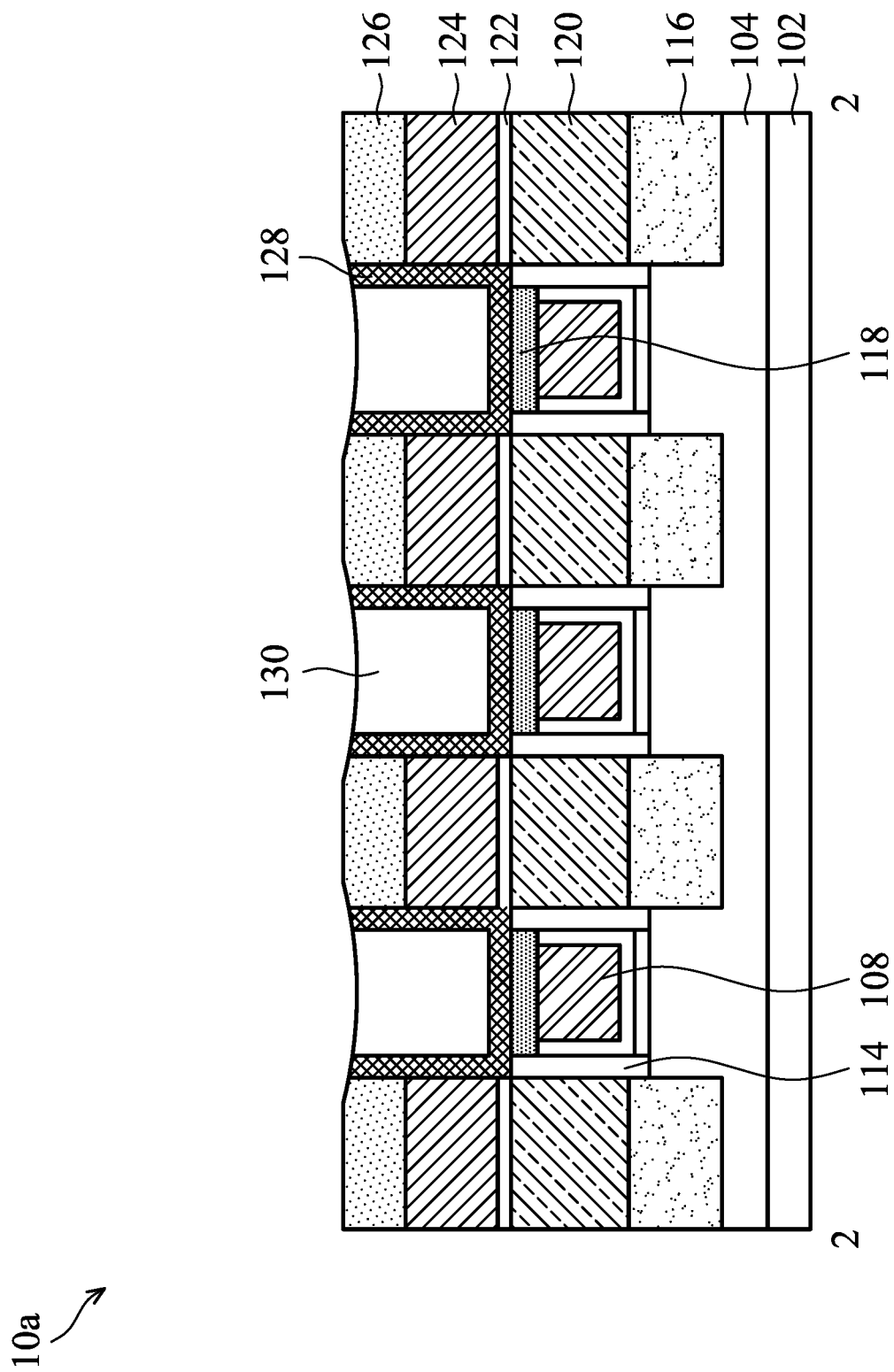

Next, a planarization process such as a chemical mechanical polishing (CMP) process or an etch back process is performed to remove excess first dielectric layer materials, as shown in FIG. 2C-1 in accordance with some embodiments. In some embodiments, as shown in FIG. 2C-1, after the planarization process, the protection layer 128 over the first cap layer 126 is removed, thereby exposing the first cap layer 126.

It should be noted that, the etch rate of the first cap layer 126, the protection layer 128, and the first dielectric layer 130 may be different. For example, the first dielectric layer 130 may be consumed more than the protection layer 128 and the first cap layer 126. Therefore, the top surface of the first dielectric layer 130 may be lower than the top surface of the protection layer 128. In addition, the top surface of the protection layer 128 layer is lower than the top surface of the first cap layer 126. As shown in FIG. 2C-1, the top surface of the first dielectric layer 130 is shaped like a dish.

Figures 2, 2C:
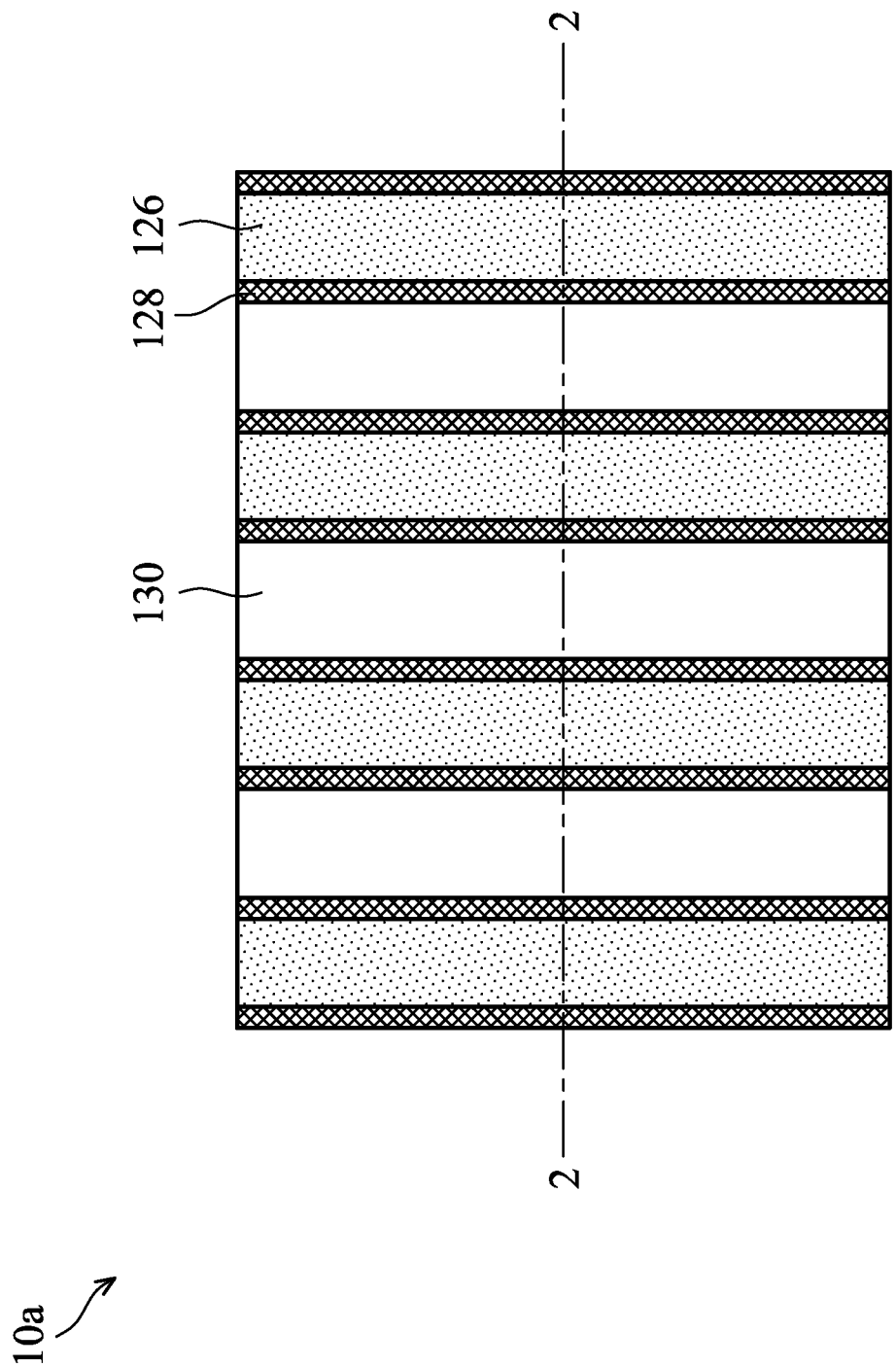

FIG. 2C-2 is a top view of semiconductor structure 10a shown in FIG. 2C-1. FIGS. 2C-1 shows a cross-sectional representation taken along line 2-2 in FIG. 2C-2.

Figures 1, 2D:
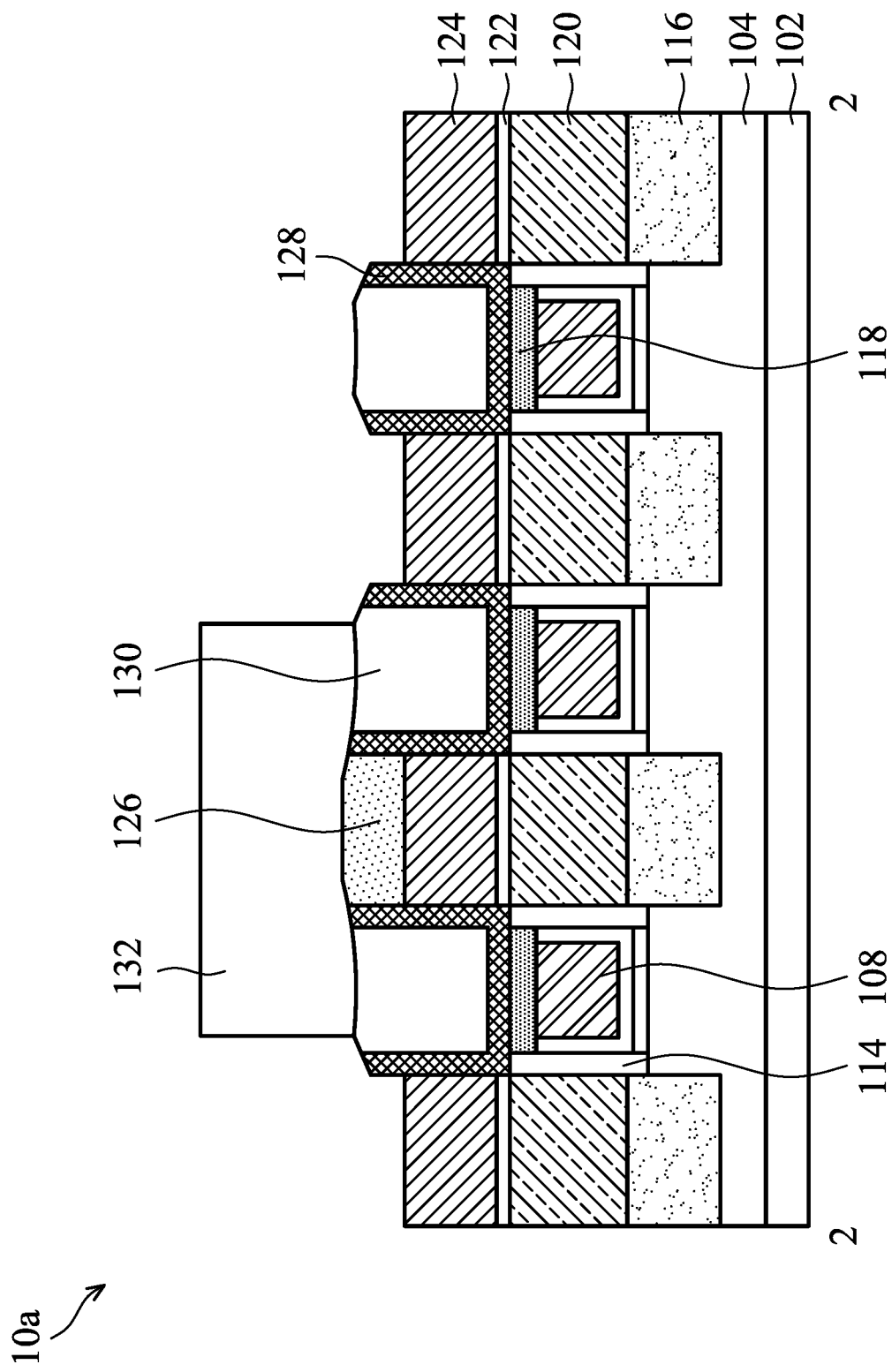
Figures 2, 2D:
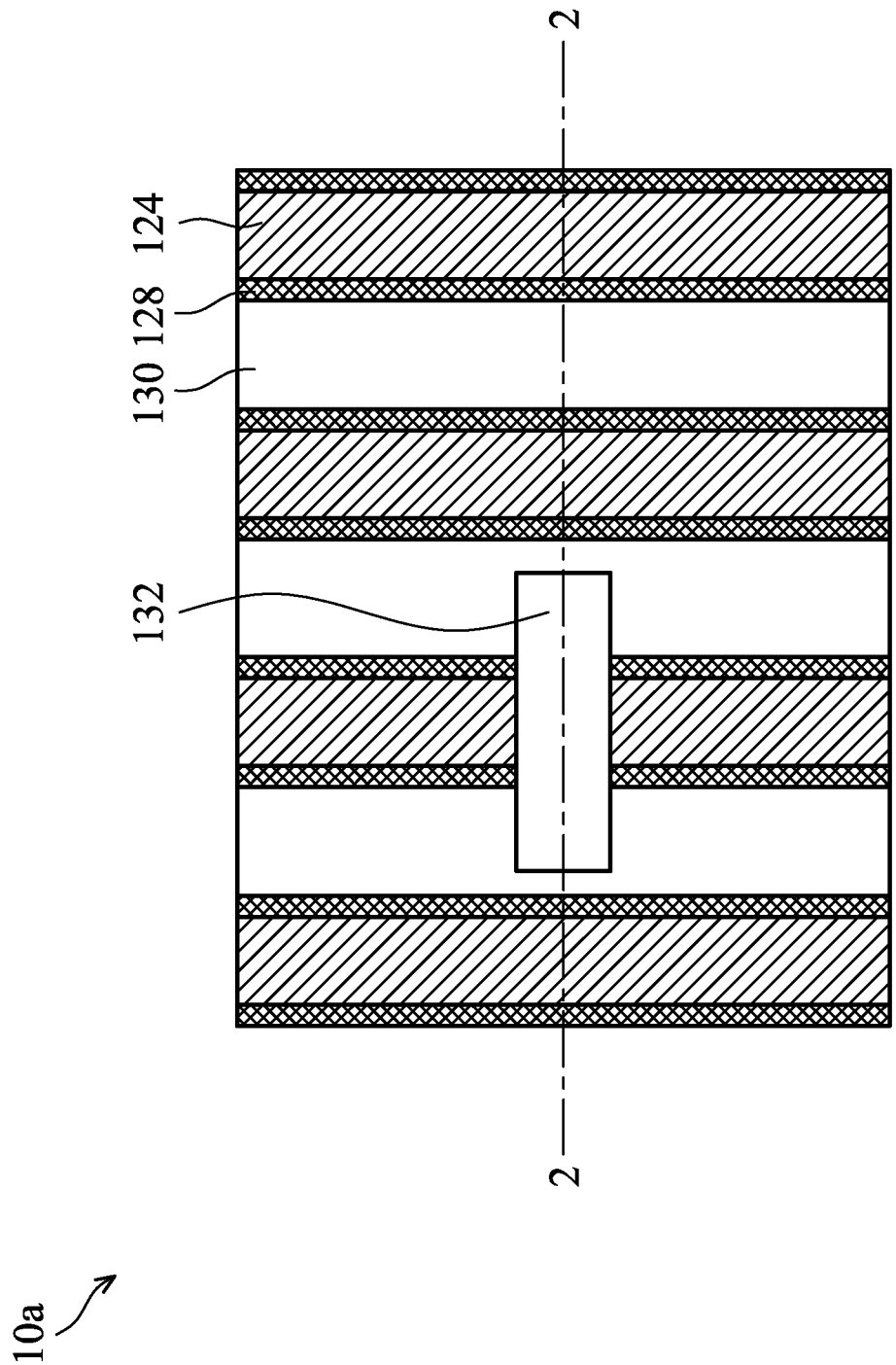

Next, the first cap layer 126 and the metal layer 124 are patterned and a portion of the first cap layer 126 not covered by a photoresist layer 132 is etched, as shown in FIG. 2D-1 in accordance with some embodiments. The portion of the first cap layer 126 not covered by a photoresist layer 132 may be etched by using etchers (ICP, CCP, or remote plasma) with etch gas of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, other applicable gases, or a combination thereof. The etching process may also include wet clean removing, or non-plasma chemical gas etching.

FIG. 2D-2 is a top view of semiconductor structure 10a shown in FIG. 2D-1. FIGS. 2D-1 shows a cross-sectional representation taken along line 2-2 in FIG. 2D-2.

Figures 1, 2E:
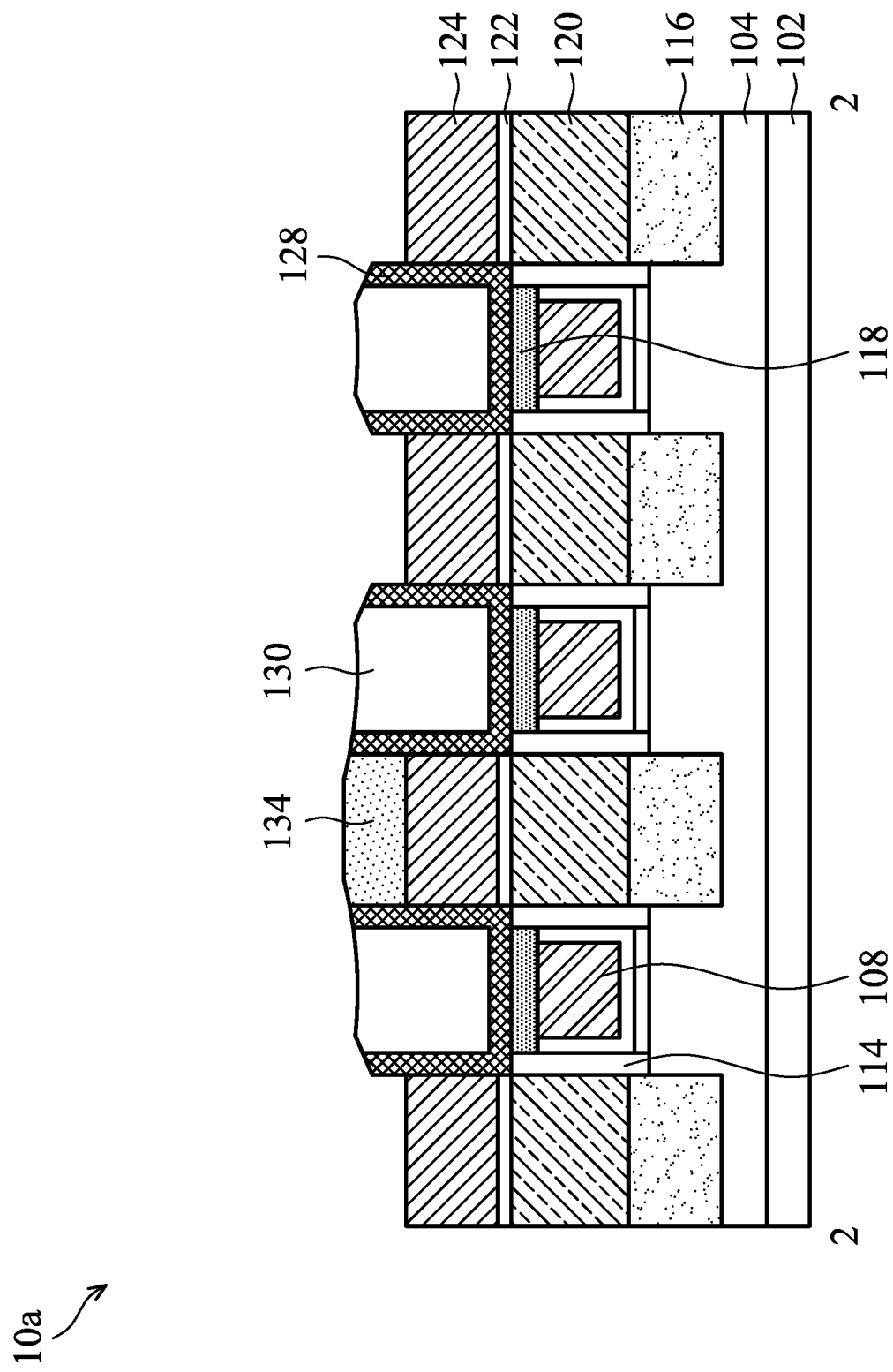
Figures 2, 2E:
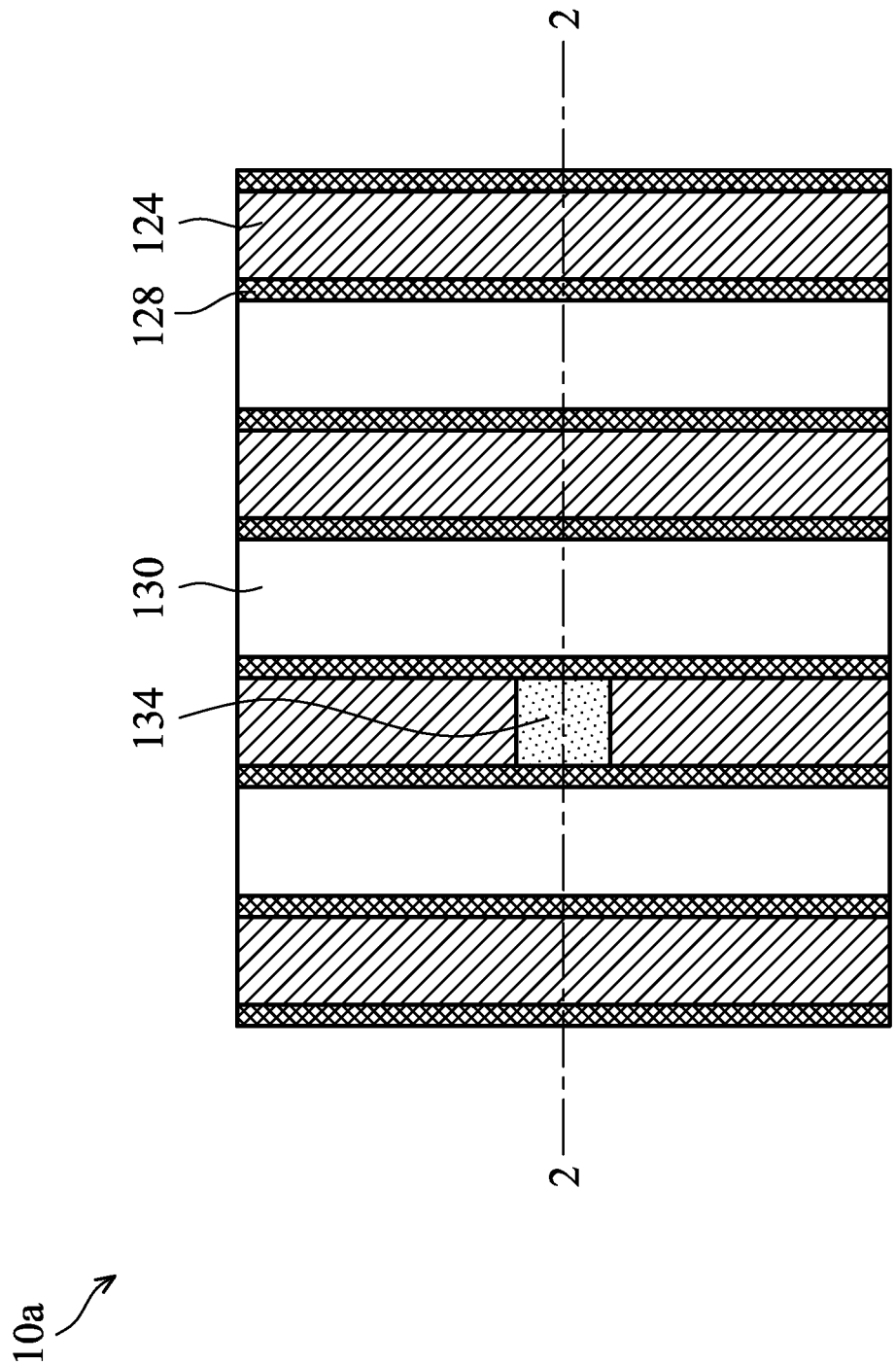

Afterwards, the photoresist layer 132 covering the first cap layer 126 is removed, as shown in FIG. 2E-1 in accordance with some embodiments. After removing the photoresist layer 132 covering the first cap layer 126, a via cap plug 134 is formed over the metal layer 124. The photoresist layer 132 may be removed use etchers such as ICP, CCP, remote plasma, other applicable etchers, or a combination thereof. The etching gas may include $O_2$, $CO_2$, CO, $N_2$, $H_2$, Ar, He, $CH_3F$, $CH_2F_2$, $CHF_3$, $C_4F_8$, $C_4F_6$, $CF_4$, other applicable gases, or a combination thereof. The etching process may also include a wet clean removing, baking, non-plasma chemical gas etching, other applicable process, or a combination thereof.

FIG. 2E-2 is a top view of semiconductor structure 10a shown in FIG. 2E-1. FIGS. 2E-1 shows a cross-sectional representation taken along line 2-2 in FIG. 2E-2.

Figure 2F:
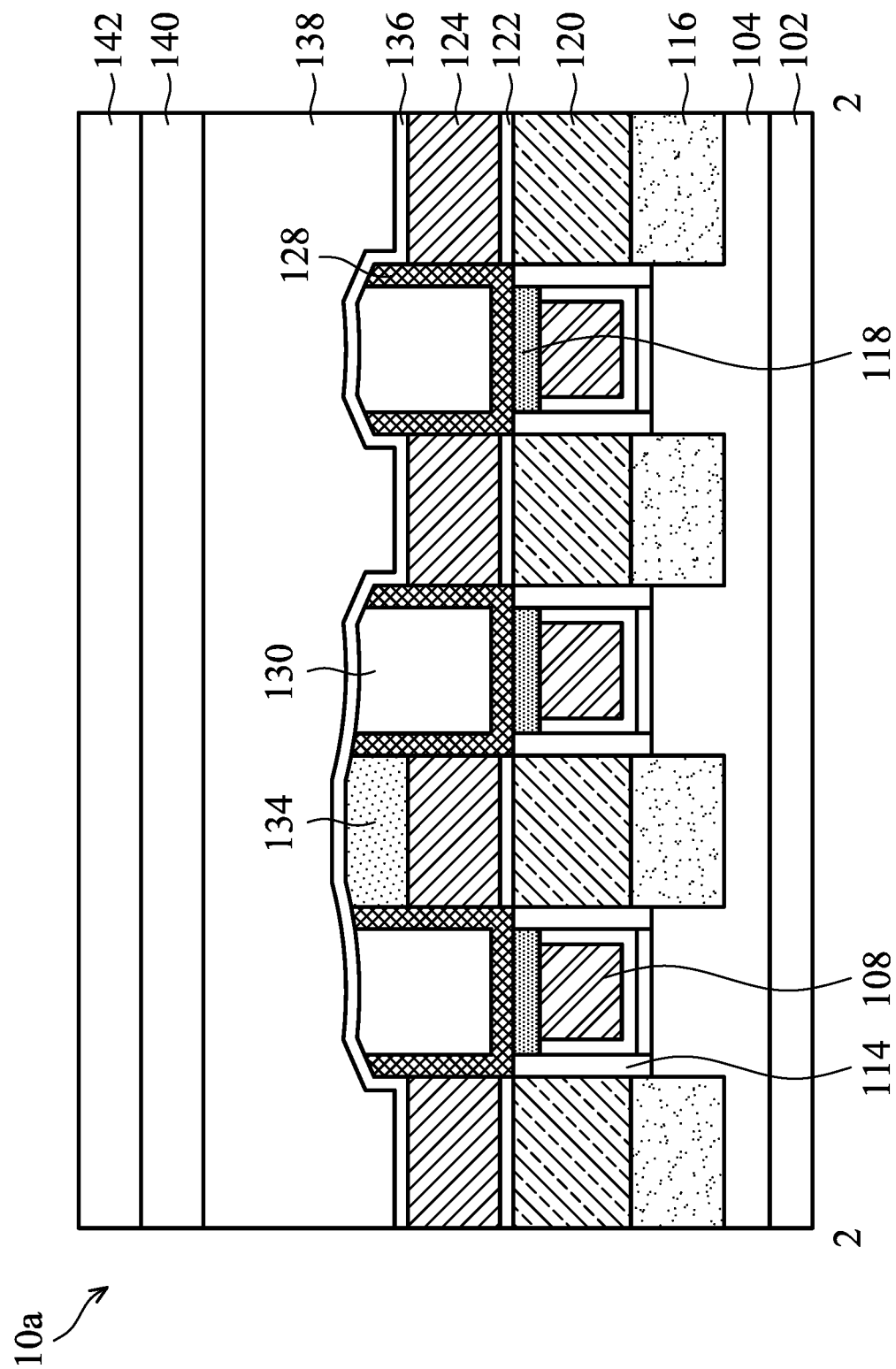

Afterwards, a second cap layer 136 is conformally deposited over the metal layer 124, the first dielectric layer 130, and the via cap plug 134, as shown in FIG. 2F in accordance with some embodiments. The second cap layer 136 may protect the metal layer 124. The second cap layer 136 may include Si, SiO, SiN, SiC, SiON, SiOC, metal nitrides, metal oxides, other applicable materials, or a combination thereof. In some embodiments, the second cap layer 136 and the protection layer 128 are made of the same material. In some embodiments, the second cap layer 136 and the protection layer 128 are made of different materials. In some embodiments, the second cap layer 136 and the via cap plug 134 are made of different materials, ensuring sufficient etching selectivity between the second cap layer 136 and the via cap plug 134 for a subsequent etching process. In some embodiments, as shown in FIG. 2F, the second cap layer 136 has a thickness in a range of about 5 Å to about 200 Å. If the second cap layer 136 is too thick, the capacitance may be too great. If the second cap layer 136 is too thin, it may not protect the metal layer 124 well.

Next, a second dielectric layer 138 is formed over the second cap layer 136, as shown in FIG. 2F in accordance with some embodiments. As shown in FIG. 2F, the second dielectric layer 138 is formed over the via cap plug 134 and the metal layer 124. The second dielectric layer 138 may include SiC, $SiO_2$, SiOC, SiN, SiCN, SiON, SiOCN, other applicable materials, or a combination thereof. The second dielectric layer 138 may be formed by a spin-on coating process, a chemical vapor deposition process, an atomic layer deposition process, a physical vapor deposition process, other applicable processes, or a combination thereof. In some embodiments, the second dielectric layer 138 and the first dielectric layer 130 are made of the same material. In some embodiments, the second dielectric layer 138 and the first dielectric layer 130 are made of different materials.

In some embodiments, the etching selectivity between the second dielectric layer 138 and the second cap layer 136 is in a range of about 0.1 to about 100. The etching selectivity between the second dielectric layer 138 and the second cap layer 136 may be modified by tuning the etching gas ratio, the power, the bias, the pressure, and the temperature in a plasma etching process.

In some embodiments, the etching selectivity between the second dielectric layer 138 and the via cap plug 134 is in a range of about 0.1 to about 100. The etching selectivity between the second dielectric layer 138 and the via cap plug 134 may be modified by tuning the etching gas ratio, the power, the bias, the pressure, and the temperature in a plasma etching process.

Afterward, a third cap layer 140 is deposited over the second dielectric layer 138, and a hard mask layer 142 is formed over the third cap layer 140. The third cap layer 140 and the hard mask layer 142 may be mask layers for subsequently etching process. The third cap layer 140 may include Si, SiO, SiN, SiCN, SiON, SiOC, SiC, SiOCN, metal nitrides, metal carbide, metal oxide, metals, other applicable materials, or a combination thereof. The hard mask layer 142 may be made of Si, SiO, SiN, SiCN, SiON, SiOC, metal nitrides, metal carbide, metal oxide, metals, other applicable materials, or a combination thereof. The third cap layer 140 and the hard mask layer 142 may be formed by a chemical vapor deposition process (CVD), a physical vapor deposition process (PVD), (e.g., evaporation or sputter), an atomic layer deposition process (ALD), an electroplating process, other suitable processes, or a combination thereof.

Figure 2G:
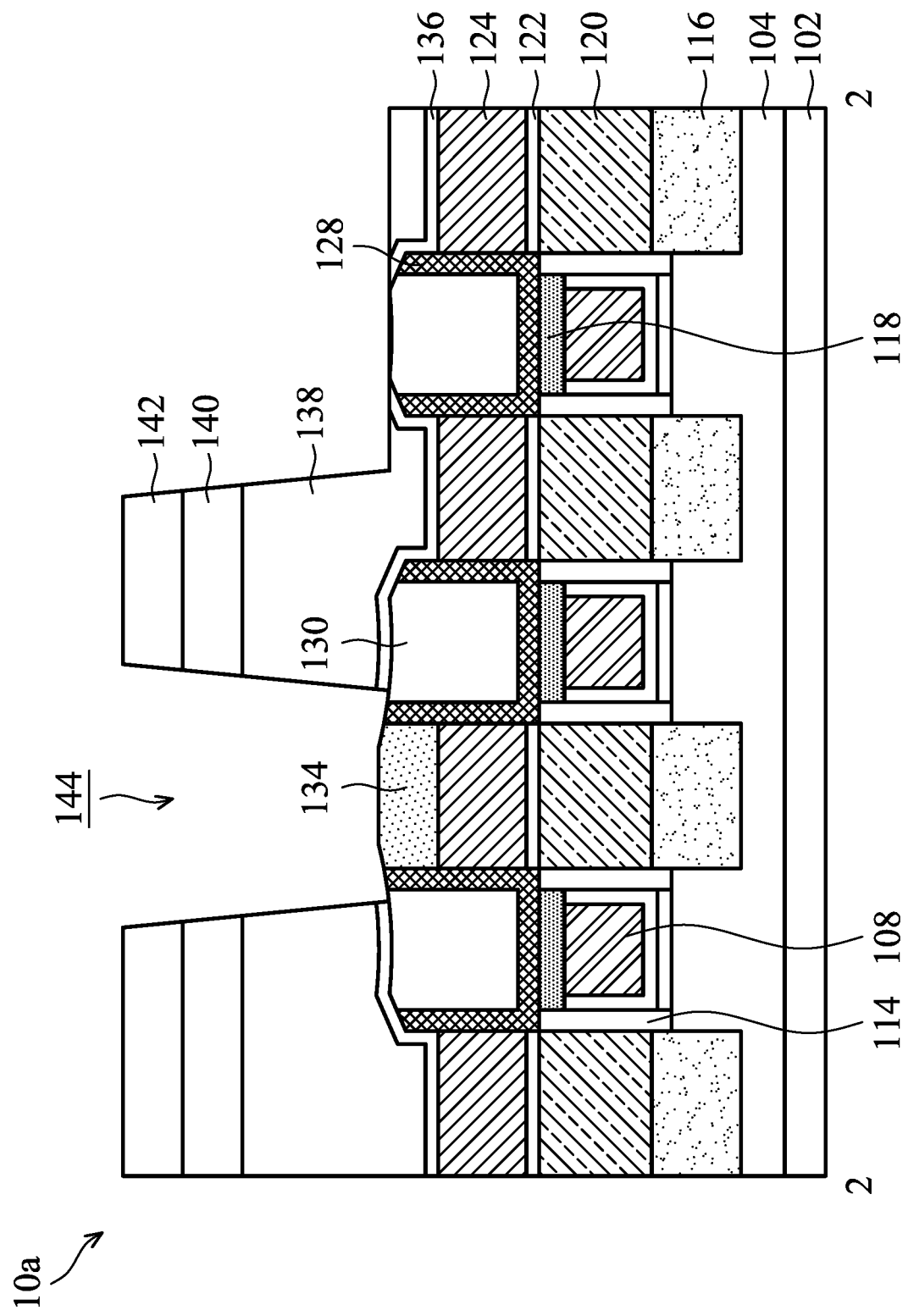

Next, a trench 144 is formed in the second dielectric material 138, the third cap layer 140, and the hard mask layer 142, as shown in FIG. 2G in accordance with some embodiments. The trench 144 may be formed by performing a patterning and an etching process. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. In some embodiments, as shown in FIG. 2G, the via cap plug 134 is exposed from the trench 144. In some embodiments, the second cap layer 136 is exposed from the trench 144. In some embodiments, the second cap layer 136 is consumed during forming the trench 144.

Figure 2H:
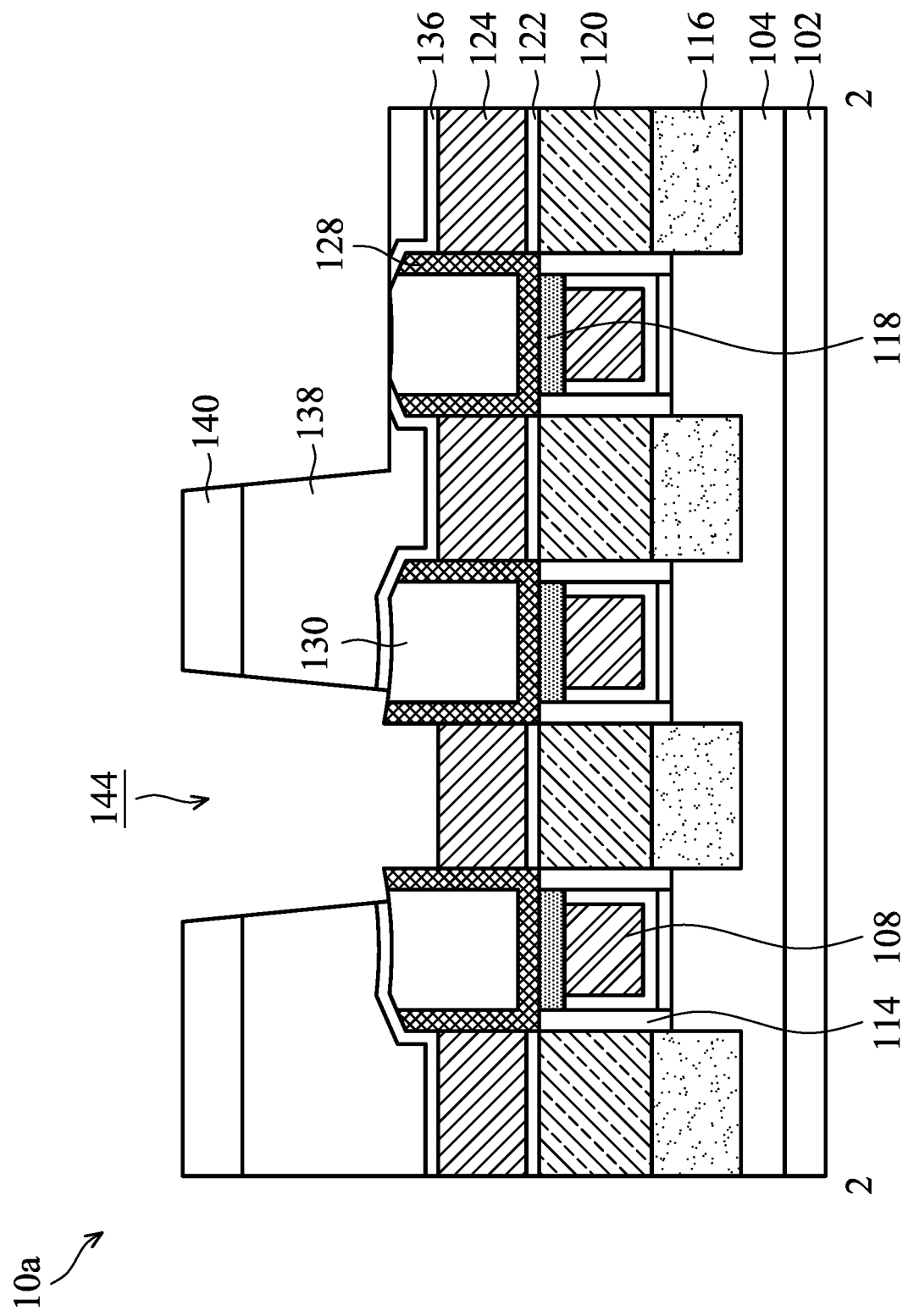

Next, the hard mask layer 142 and the via cap plug 134 are removed, as shown in FIG. 2H in accordance with some embodiments. As shown in FIG. 2H, the trench 144 is enlarged since via cap plug 134 is removed. Meanwhile, the protection layer 128 remains over the sidewall of the bottom portion of the trench 144 after removing the via cap plug 134. The hard mask layer 142 and the via cap plug 134 may be removed by wet cleaning, plasma etching, non-plasma chemical gas etching, or a combination thereof.

Next, an etching process is optionally performed over the sidewall of the bottom portion of the trench 144 (not shown). The etching process may round the corner of the bottom portion of the trench 144 and make the subsequently filling process easier. In some embodiments, the protection layer 128 over the sidewall of the bottom portion of the trench 144 is consumed during the etching process. The etching process may include plasma etching or non-plasma chemical gas etching. In some embodiments, the etching may use Ar, $N_2$, other applicable etching gases, or a combination thereof for fine-tuning the profile of the bottom portion of the trench 144. In some embodiments, the etching may use fluorine-based gases for significantly modifying the profile of the bottom portion of the trench 144.

In some embodiments, a barrier layer is optionally conformally formed over the bottom surface and the sidewalls of the trench 144 (not shown). The barrier layer may be formed before filling the conductive material in the trench 144 to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Figure 2I:
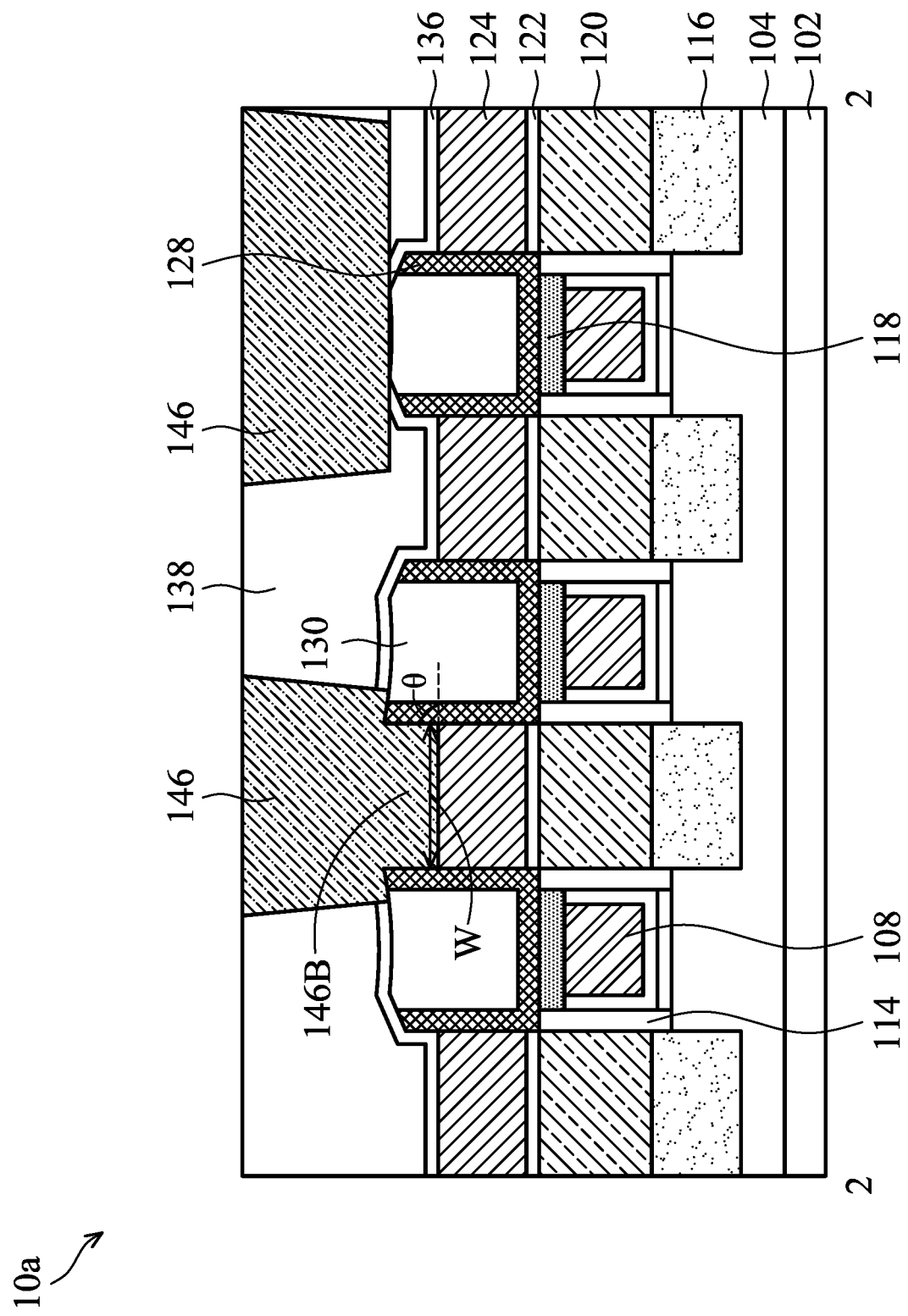

Afterwards, a conductive structure 146 is formed in the trench 144, as shown in FIG. 2I in accordance with some embodiments. The conductive structure 146 may be made of metal materials (e.g., W, Mo, or Co), metal alloys, other applicable conductive materials, or a combination thereof. The conductive structure 146 may be formed by a chemical vapor deposition process (CVD), a physical vapor deposition process (PVD, e.g., evaporation or sputter), an atomic layer deposition process (ALD), an electroplating process, other suitable processes, or a combination thereof to deposit the conductive materials of the conductive structure 146, and then a chemical mechanical polishing (CMP) process or an etch back process is optionally performed to remove excess conductive materials.

As shown in FIG. 2I, the bottom portion 146B of the conductive structure 146 is surrounded by the protection layer 128 and second cap layer 136. In some embodiments, the bottom portion 146B of the conductive structure 146 is a via structure 146B. In some embodiments, as shown in FIG. 2I, the angle θ between the sidewall of the via structure 146B and a bottom surface of the via structure 146B is in a range of about 40 degrees to about 95 degrees. It may be difficult to fill in the conductive materials in the trench 144 for the higher angle θ. It may cause electric leakage issue for the lower angle θ. In some embodiments, as shown in FIG. 2I, a width W of the via structure 146B is in a range of about 5 nm to about 300 nm. If the width W is too narrow, it may be difficult to fill the conductive materials in the trench 144.

By forming a via cap plug 134, the via structure 146B may be defined separately and may be self-aligned. The dimension and the profile of the via structure 146B may also be defined by the via cap plug 134, and profile of the via structure 146B is more well-controlled. Without extra etching stop layers, the capacitance may be reduced. In addition, since the via structure 146B is self-aligned, the overlay shift issue of the via structure 146B may be prevented, and electrical performance may be enhanced.

Figures 1, 3A:
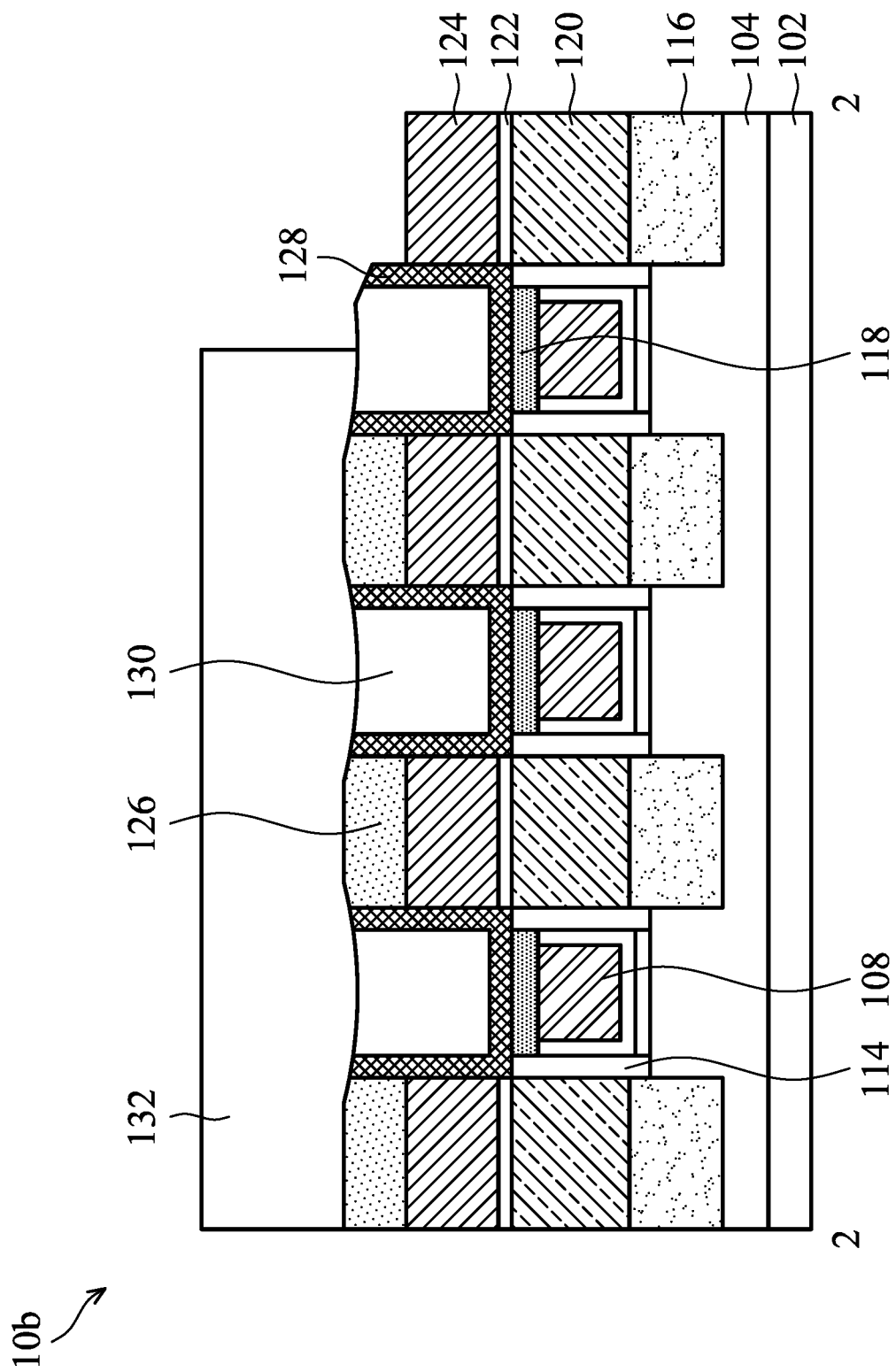
Figures 2, 3A:
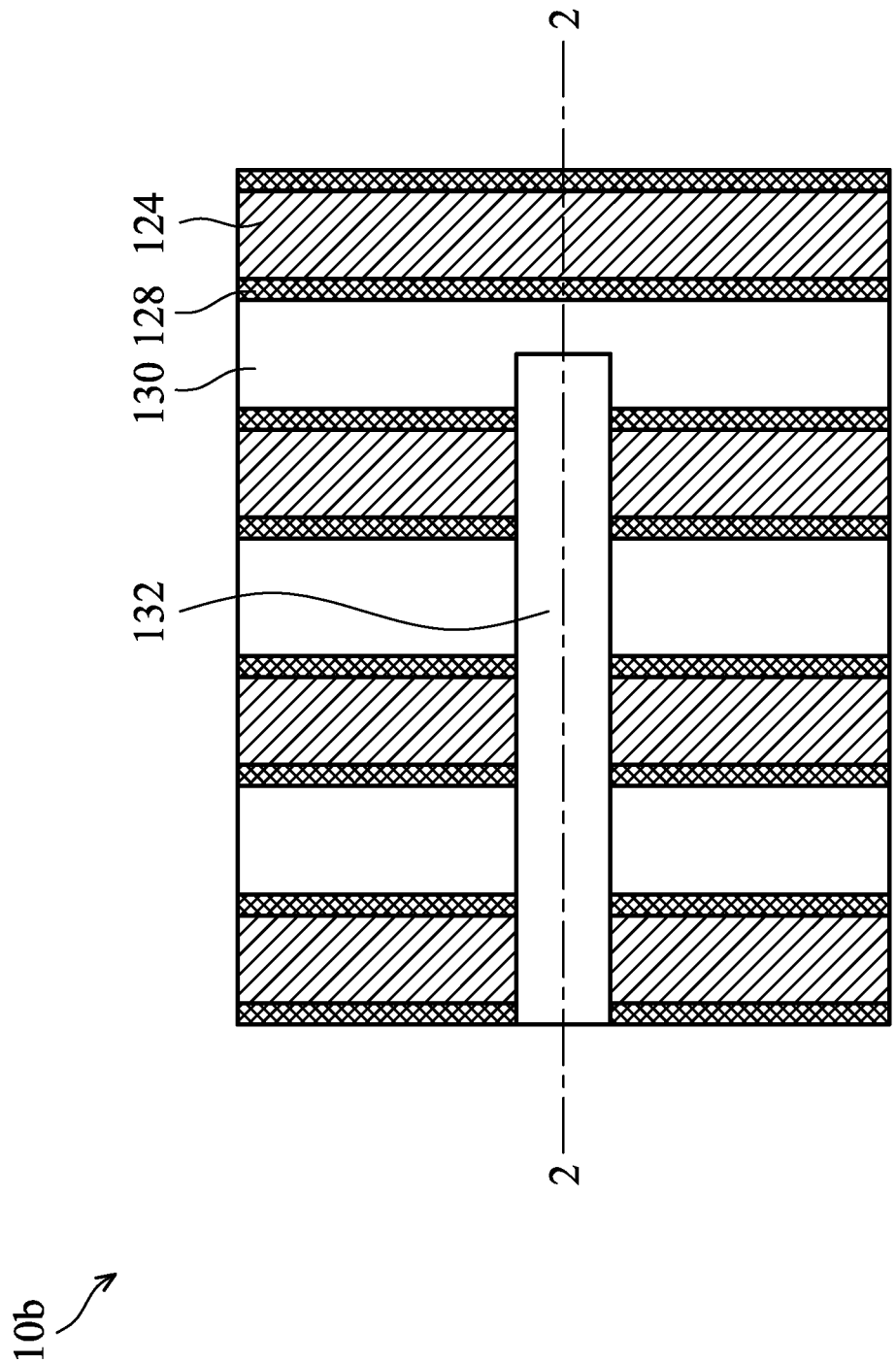
Figures 1, 3B:
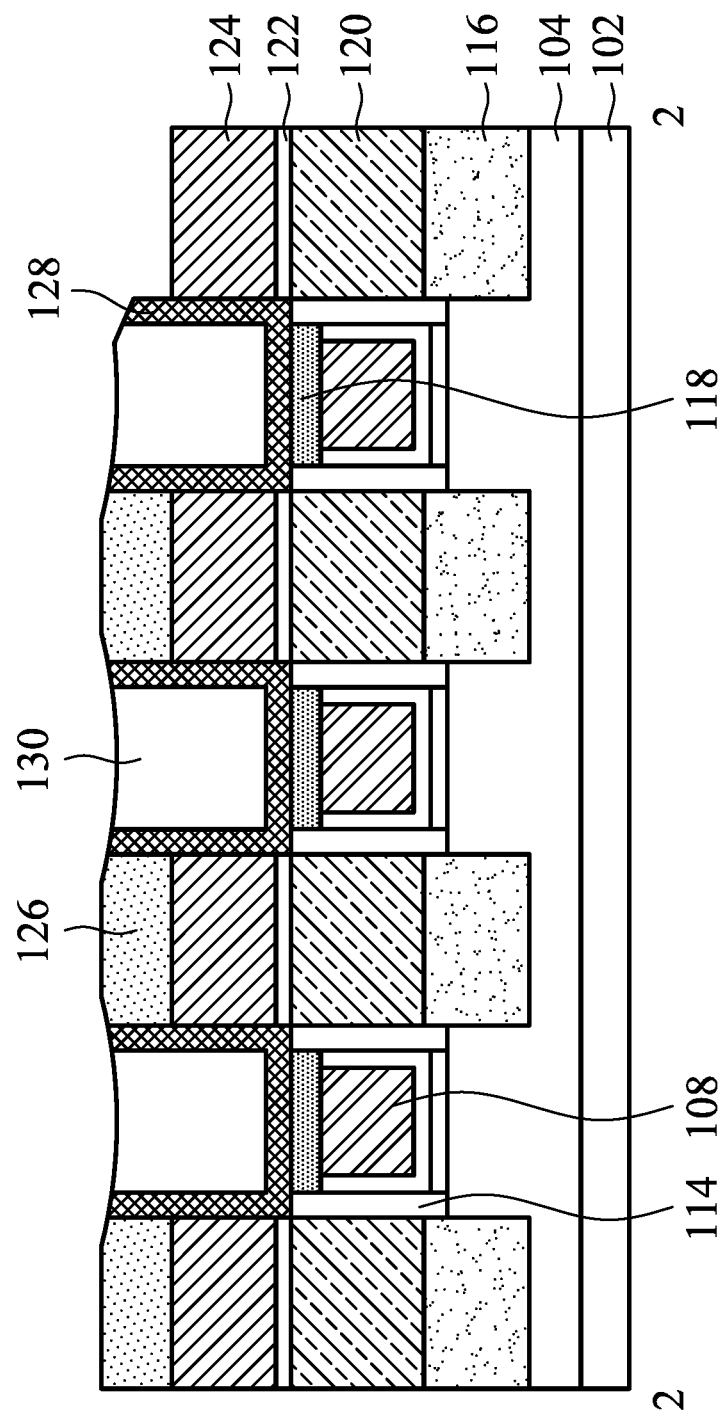
Figures 2, 3B:
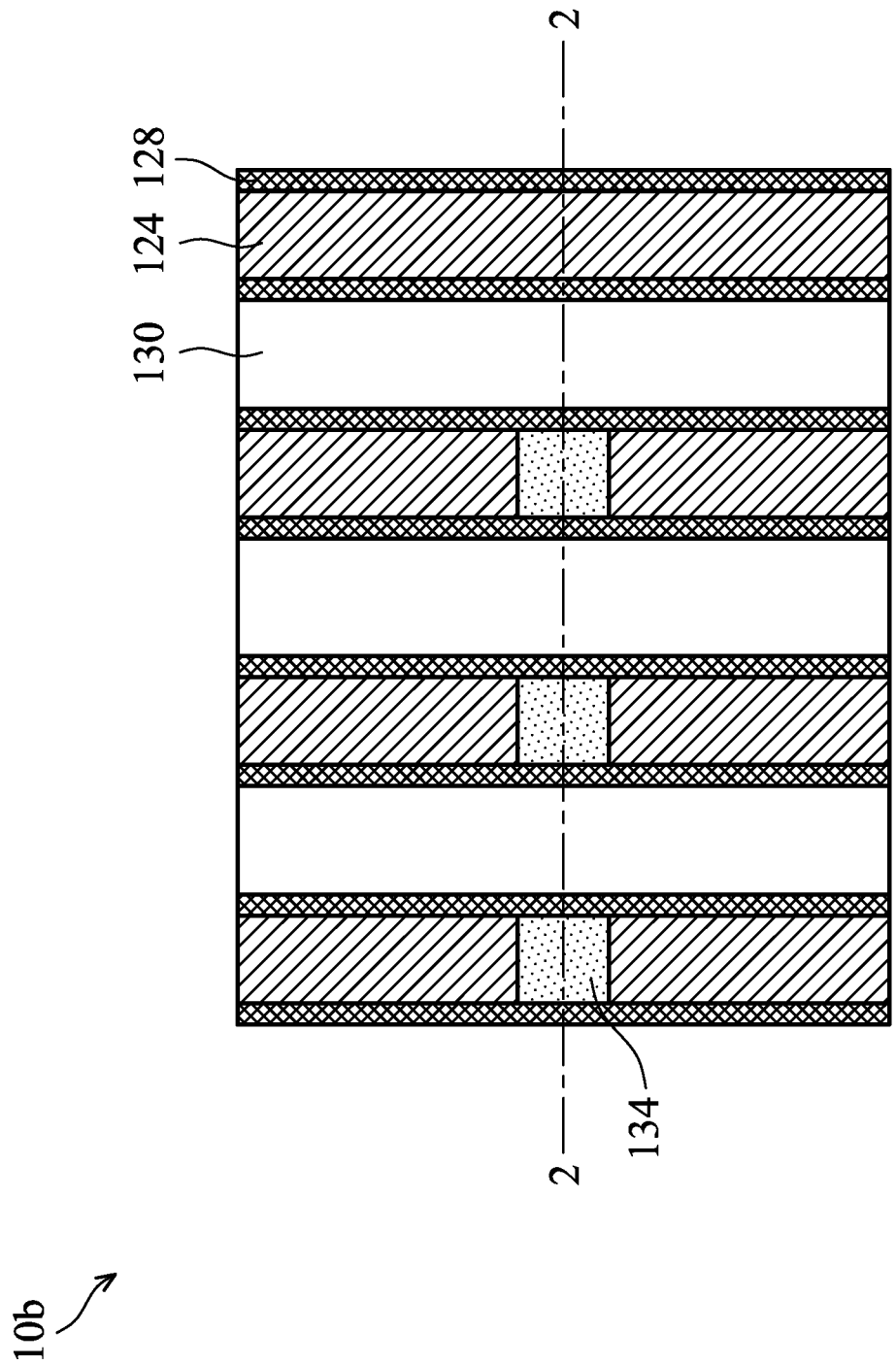

Many variations and/or modifications may be made to the embodiments of the disclosure. FIGS. 3A-1, 3B-1, and 3C are cross-sectional representations of a stage of forming a modified semiconductor structure 10b, in accordance with some embodiments of the disclosure. FIGS. 3A-2 and 3B-2 are top views of a stage of forming a modified semiconductor structure 10b, in accordance with some embodiments of the disclosure. FIGS. 3A-1 and 3B-1 shows a cross-sectional representation taken along line 2-2 in FIGS. 3A-2 and 3B-2. Some processes or devices are the same as, or similar to, those described in the embodiments above, and therefore the descriptions of these processes and devices are not repeated herein. The difference from the embodiments described above is that, as shown in FIGS. 3A-1 and 3A-2 in accordance with some embodiments, the photoresist layer 132 covers several first cap layers 126 separated by the protection layer 128 and the first dielectric layer 130.

Afterwards, as shown in FIGS. 3B-1 and 3B-2, after the photoresist layer 132 is removed, more than one via cap plugs 134 are formed over the metal layer 124 between the first dielectric layers 130. The number of via cap plugs 134 is defined by the shape and size of the photoresist layer 132 as shown in FIGS. 3A-1 and 3A-2.

Figure 3C:
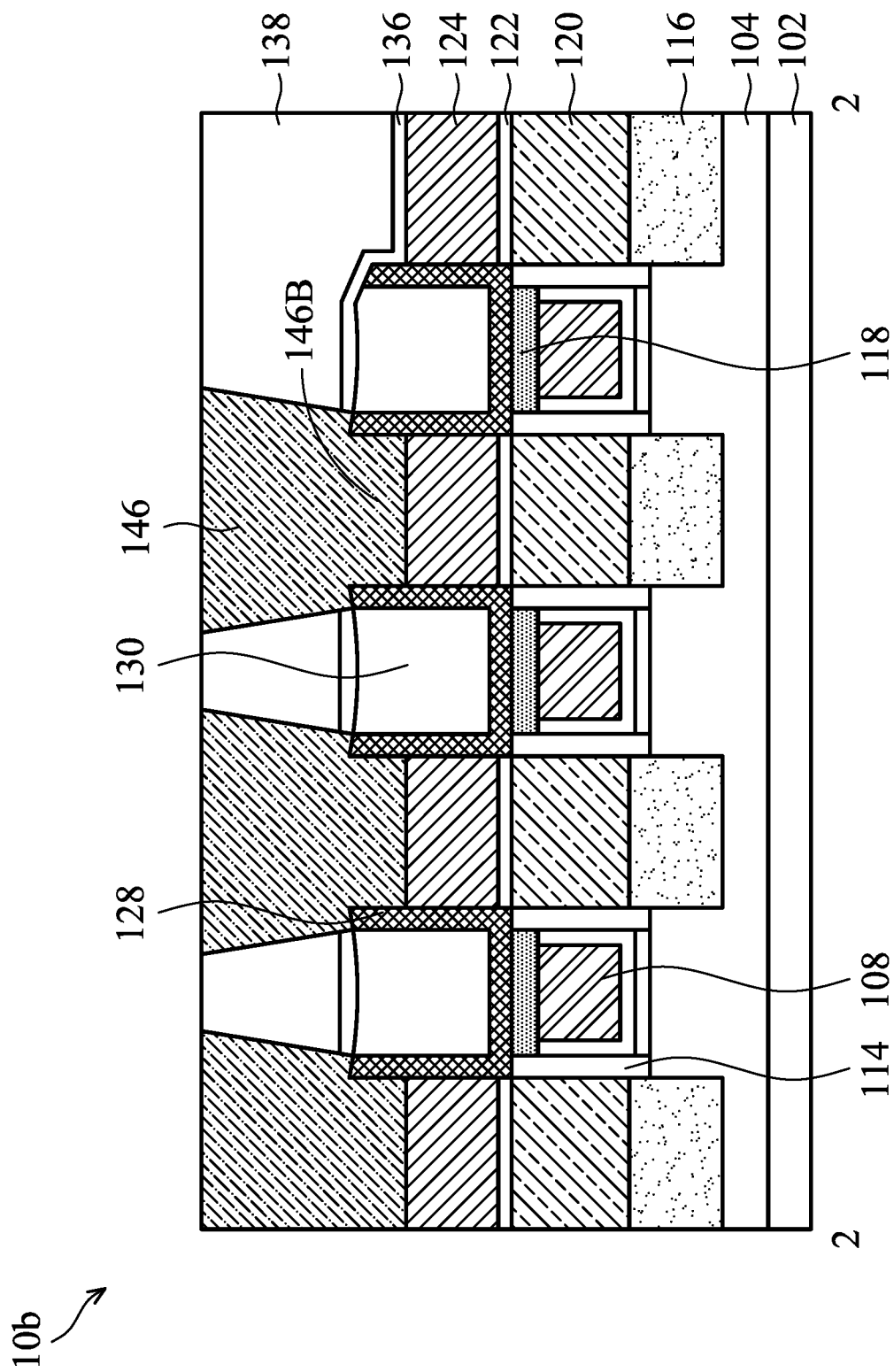

Next, as shown in FIG. 3C, the via cap plugs 134 between the first dielectric layers 130 are removed, and more than one conductive structures 146, including the via structures 146B are formed over the metal layer 124 between the first dielectric layers 130. In some embodiments, the via structures 146B of adjacent conductive structures 146 are separated by the protection layer 128, the second cap layer 136, and the first dielectric layers 130. Since the via structures 146B are formed simultaneously, the dimensions and the profile of the via structures 146B may be consistent.

By forming a via cap plug 134, the via structure 146B may be defined separately and may be self-aligned. The dimension and the profile of the via structure 146B may also be defined by the via cap plug 134, and profile of the via structure 146B is more well-controlled. Without extra etching stop layers, the capacitance may be reduced. In addition, since the via structure 146B is self-aligned, the overlay shift issue of the via structure 146B may be prevented, and electrical performance may be enhanced. By modifying the shape and the size of the photoresist layer 132, more than one via structure 146B may be formed simultaneously, the dimensions and the profile of nearby via structures 146B may be consistent.

Figures 1, 4A:
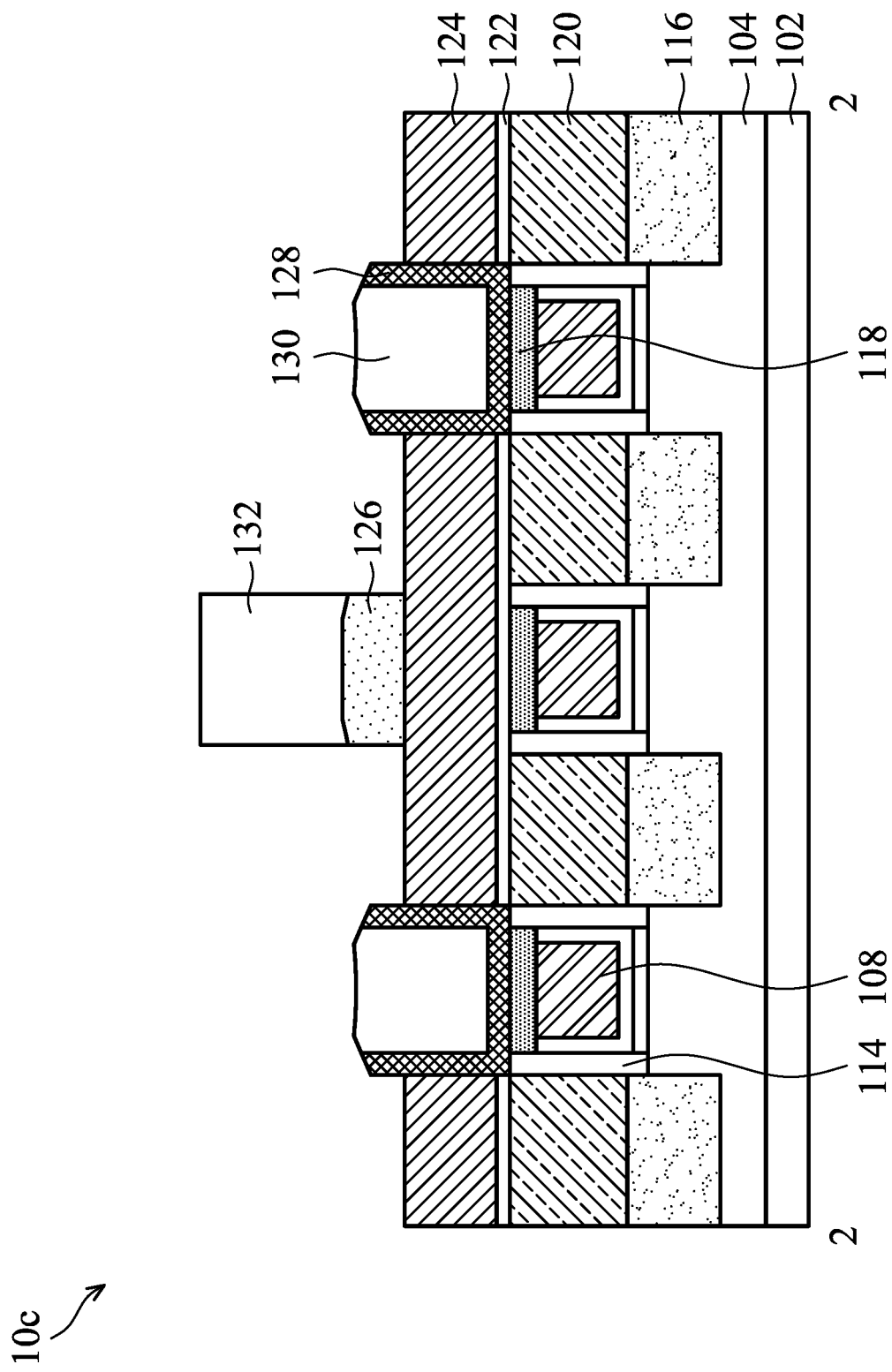
Figures 2, 4A:
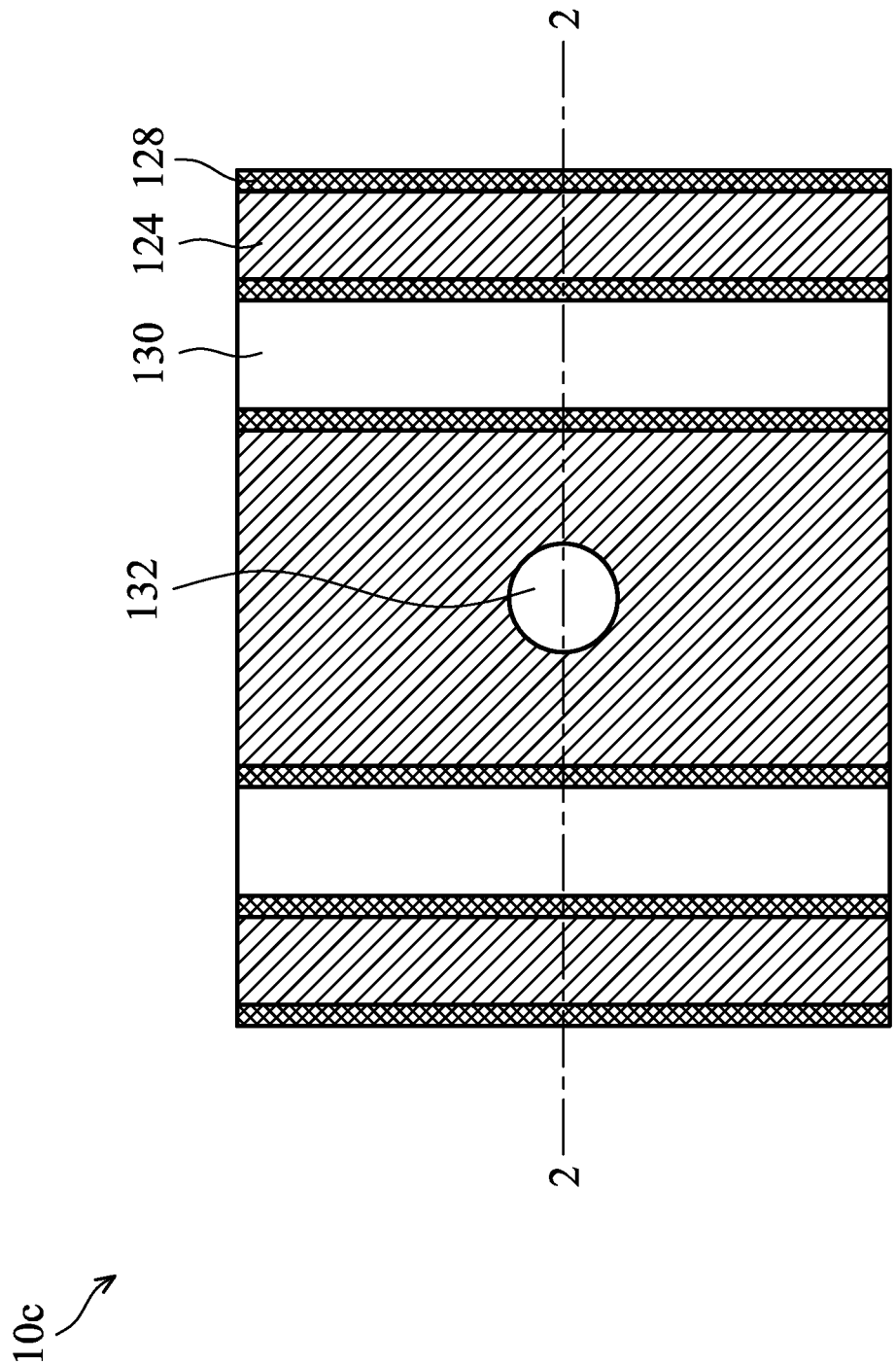
Figures 1, 4B:
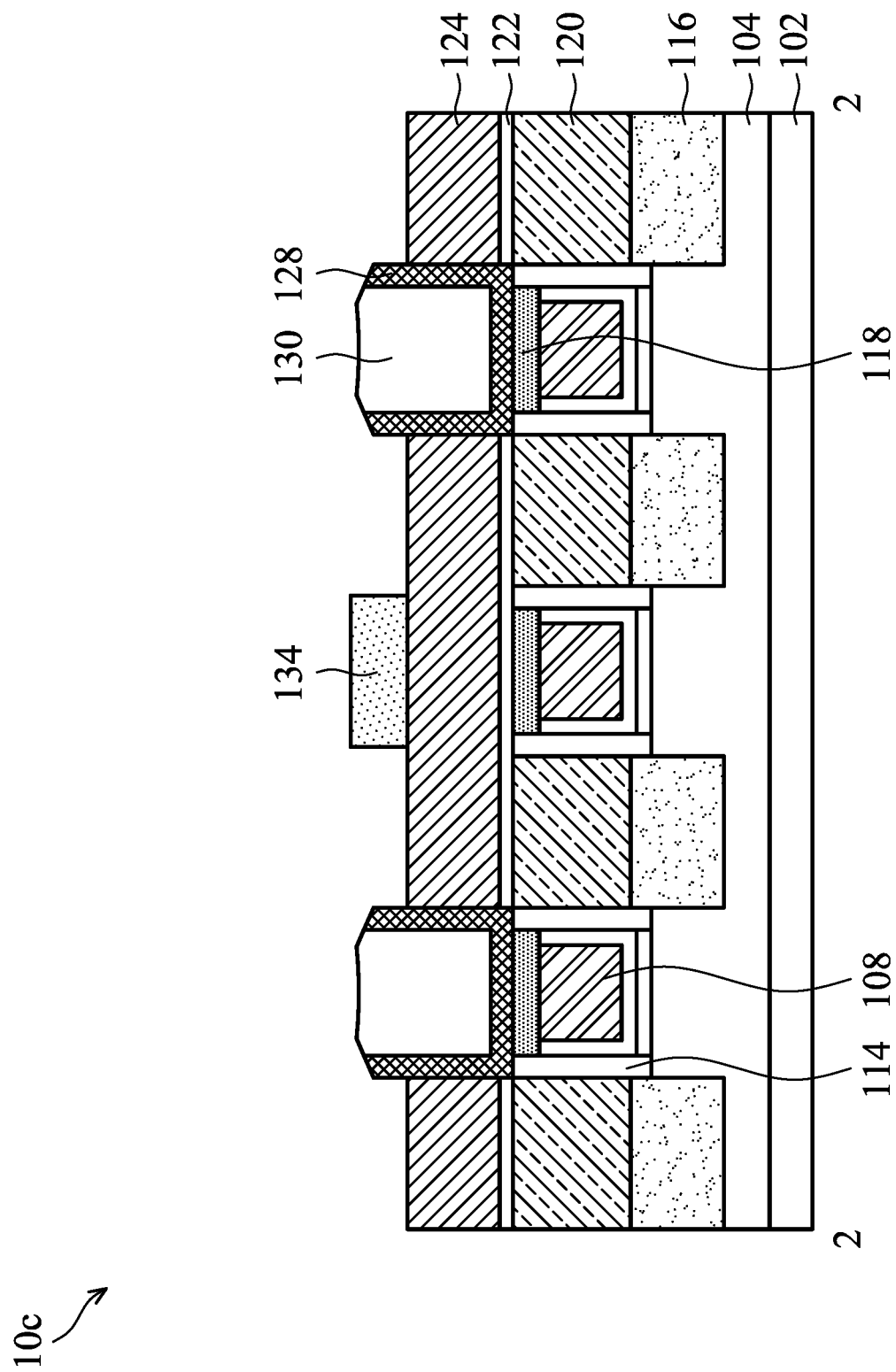
Figures 2, 4B:
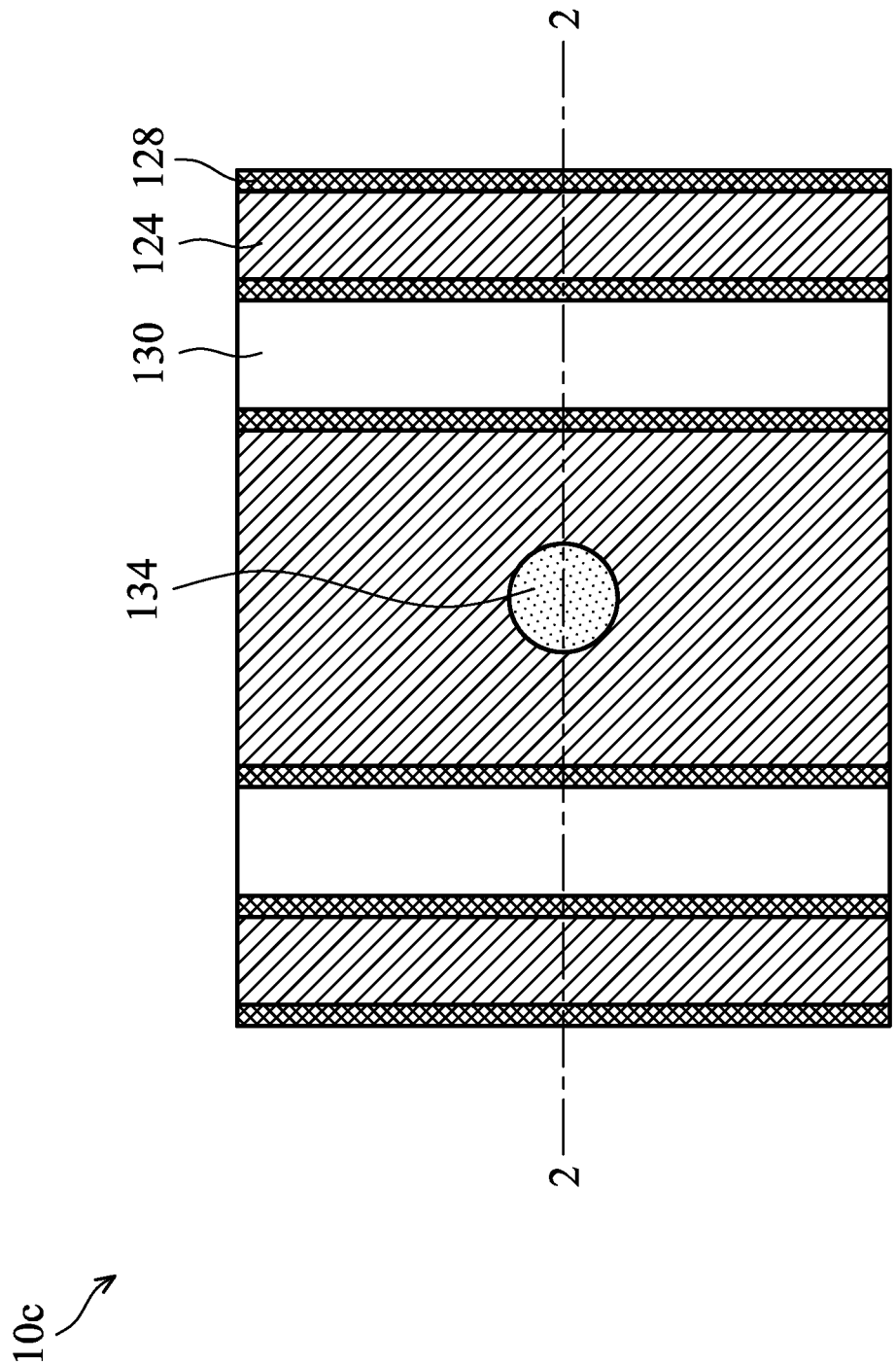

Many variations and/or modifications may be made to the embodiments of the disclosure. FIGS. 4A-1, 4B-1, and 4C are cross-sectional representations of a stage of forming a modified semiconductor structure 10c, in accordance with some embodiments of the disclosure. FIGS. 4A-2 and 4B-2 are top views of a stage of forming a modified semiconductor structure 10c, in accordance with some embodiments of the disclosure. FIGS. 4A-1 and 4B-1 shows a cross-sectional representation taken along line 2-2 in FIGS. 4A-2 and 4B-2. Some processes or devices are the same as, or similar to, those described in the embodiments above, and therefore the descriptions of these processes and devices are not repeated herein. The difference from the embodiments described above is that, as shown in FIGS. 4A-1 and 4A-2 in accordance with some embodiments, the photoresist layer 132 covers only a portion of the first cap layers 126 between the protection layer 128 and the first dielectric layer 130.

In some embodiments, the size of the first cap layer 126 covered by the photoresist layer 132 is smaller than the space between the protection layer 128 on the opposite sides of the first cap layer 126, which allows the first cap layer 126 to remain separate from the protection layer 128.

Afterwards, as shown in FIGS. 4B-1 and 4B-2, after the photoresist layer 132 is removed, a via cap plug 134 is formed over the metal layer 124 between the first dielectric layers 130. The via cap plug 134 is separated from nearby protection layer 128 and the first dielectric layer 130. The size and the location of the via cap plug 134 is defined by the size and location of the photoresist layer 132 as shown in FIGS. 4A-1 and 4A-2.

Figure 4C:
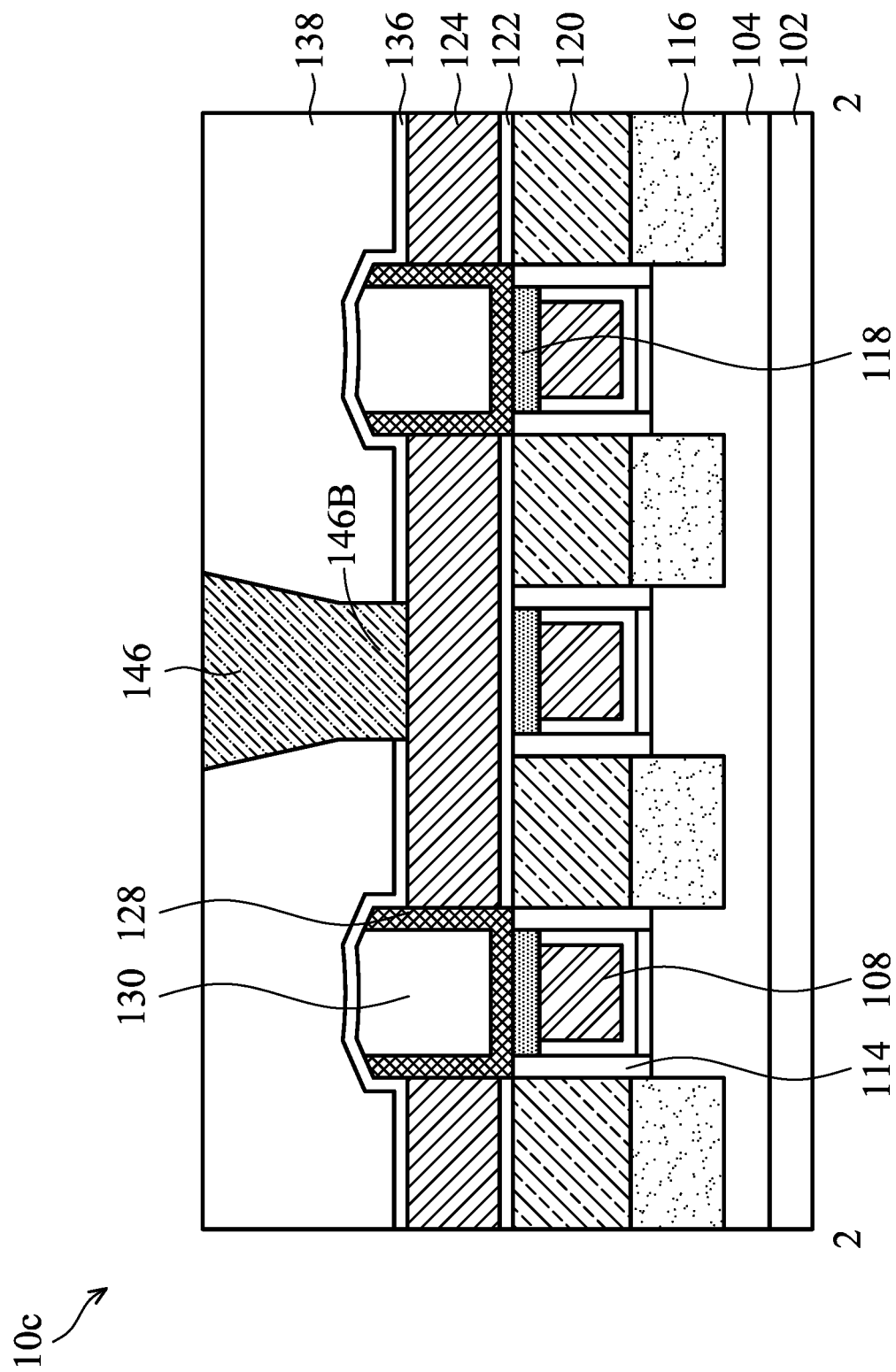

Next, as shown in FIG. 4C, the via cap plug 134 is removed, and the conductive structures 146, including the via structure 146B is formed over the metal layer 124 between the first dielectric layers 130. In some embodiments, the bottom portion 146B (the via structure 146B) is separated from the protection layer 128. The via structure 146B may be formed when the spacing between adjacent protection layers 128 is greater than the size of the via structure 146B.

By forming a via cap plug 134, the via structure 146B may be defined separately and may be self-aligned. The dimension and the profile of the via structure 146B may also be defined by the via cap plug 134, and profile of the via structure 146B is more well-controlled. Without extra etching stop layers, the capacitance may be reduced. In addition, since the via structure 146B is self-aligned, the overlay shift issue of the via structure 146B may be prevented, and electrical performance may be enhanced. By modifying the shape and the size of the photoresist layer 132, a via structure 146B smaller than the spacing between adjacent protection layers 128 may be formed, depending on the demand of circuit design.

Figure 5:
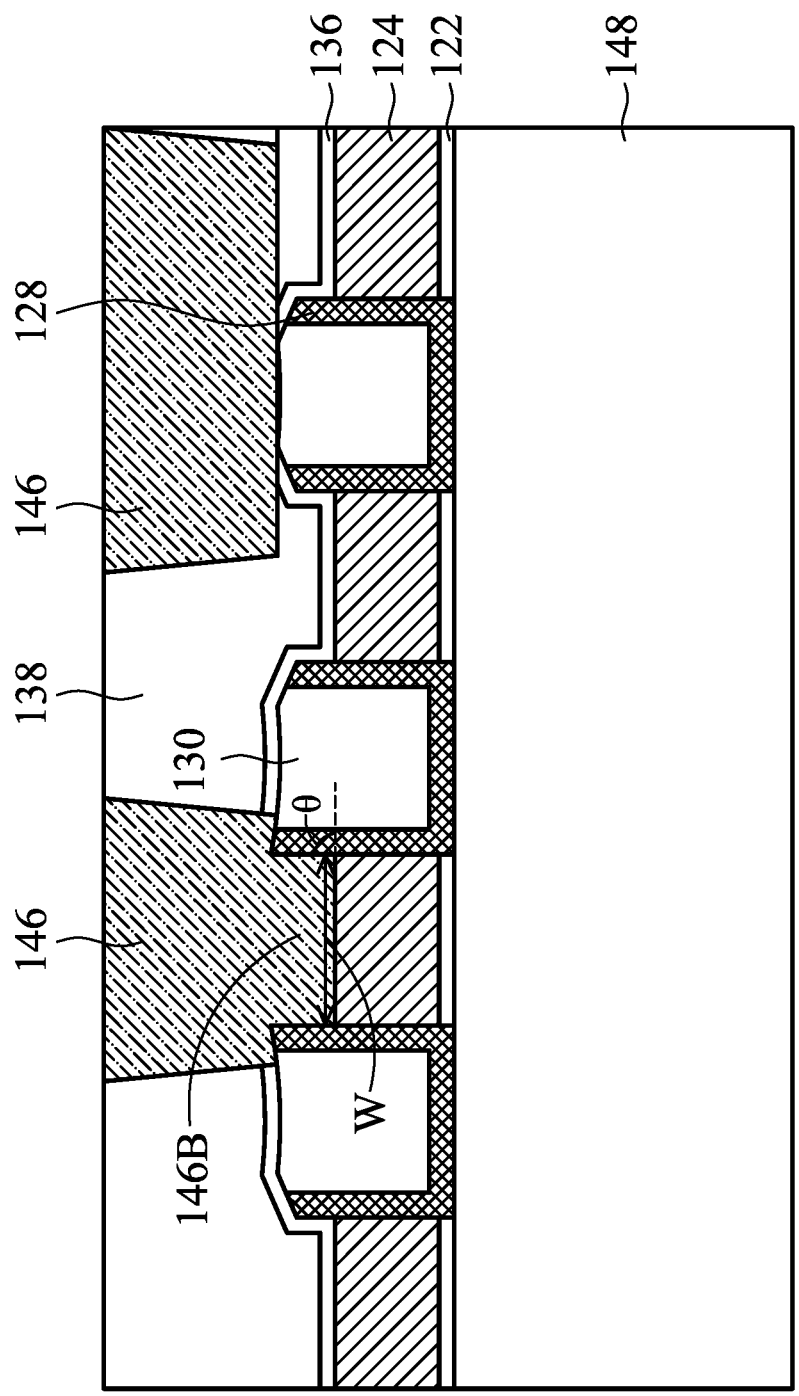
FIG. 5 is a cross-sectional representation of a semiconductor structure, in accordance with some embodiments of the disclosure.

Many variations and/or modifications may be made to the embodiments of the disclosure. FIG. 5 is a cross-sectional representation of a stage of forming a modified semiconductor structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, the glue layer 122 is formed over a device region 148.

It should be noted that, although in previous embodiments, a finFET structure 10a is formed the device region 148. The present disclosure is not limited thereto. In some embodiments, the device region 148 includes logic devices, memory devices (e.g., static random access memories, SRAMs), radio frequency (RF) devices, input/output (I/O) devices, system-on-chip (SoC) devices, image sensor devices, other applicable types of devices, or a combination thereof.

By forming a via cap plug 134, the via structure 146B may be defined separately and may be self-aligned. The dimension and the profile of the via structure 146B may also be defined by the via cap plug 134, and profile of the via structure 146B is more well-controlled. Without extra etching stop layers, the capacitance may be reduced. In addition, since the via structure 146B is self-aligned, the overlay shift issue of the via structure 146B may be prevented, and electrical performance may be enhanced. The self-aligned via structure 146B may be formed over various devices.

As described previously, a self-aligned via structure 146B is formed. Since the via structure 146B is self-aligned, the overlay shift issue may be prevented, and electrical performance may be enhanced. With a via cap plug 134, the profile of the via structure 146B may be consistent. Without extra etching stop layers, the capacitance may be reduced. In some embodiments, as shown in FIG. 3C, multiple consistent via structures 146B are formed. In some embodiments, as shown in FIG. 4C, via structure 146B is formed in larger space between the protection layers 128.

Embodiments of a semiconductor device structure and a method for forming the same are provided. The method for forming the semiconductor structure may include forming a self-aligned via structure by defining a via cap plug first. The via cap plug may be removed after the forming the trench for filling the conductive structure. The profile of the self-aligned via structure may be consist with each other, and the overlay shift issue may be prevented. Moreover, the capacitance is also reduced since there is no extra etching stop layer.

In some embodiments, a method for forming a semiconductor structure is provided. The method for forming a semiconductor structure includes forming a fin structure over a substrate. The method for forming a semiconductor structure also includes forming a gate structure across the fin structure. The method for forming a semiconductor structure also includes depositing a metal layer over the gate structure. The method for forming a semiconductor structure also includes forming a first cap layer over the metal layer. The method for forming a semiconductor structure also includes patterning the metal layer and the first cap layer to form openings exposing the gate structure. The method for forming a semiconductor structure also includes forming a first dielectric layer in the openings. The method for forming a semiconductor structure also includes patterning the first cap layer to form a via cap plug over the metal layer. The method for forming a semiconductor structure also includes forming a second dielectric layer over the via cap plug and the metal layer. The method for forming a semiconductor structure also includes forming a trench in the second dielectric material to expose the via cap plug. The method for forming a semiconductor structure also includes removing the via cap plug to enlarge the trench. The method for forming a semiconductor structure also includes filling the trench with a conductive material.

In some embodiments, a method for forming a semiconductor structure is provided. The method for forming a semiconductor structure includes forming a fin structure over a substrate. The method for forming a semiconductor structure also includes growing a source/drain epitaxial structure over the fin structure. The method for forming a semiconductor structure also includes forming a contact structure over the source/drain epitaxial structure. The method for forming a semiconductor structure also includes depositing a metal layer over the contact structure. The method for forming a semiconductor structure also includes depositing a first cap layer over the metal layer. The method for forming a semiconductor structure also includes forming an opening in the first cap layer and the metal layer. The method for forming a semiconductor structure also includes filling the opening with a first dielectric layer. The method for forming a semiconductor structure also includes patterning the first cap layer to form a via cap plug over the metal layer. The method for forming a semiconductor structure also includes removing the via cap plug over the metal layer. The method for forming a semiconductor structure also includes forming a conductive structure over the metal layer.

In some embodiments, a semiconductor structure is provided. The semiconductor structure includes a fin structure formed over a substrate. The semiconductor structure also includes a gate structure across the fin structure. The semiconductor structure also includes a source/drain epitaxial structure formed over the fin structure. The semiconductor structure also includes a contact structure formed over the source/drain epitaxial structure. The semiconductor structure also includes a first dielectric layer formed over the gate structure. The semiconductor structure also includes a metal layer formed in the first dielectric layer. The semiconductor structure also includes a protection layer formed over the sidewalls and the bottom surface of the first dielectric layer. The semiconductor structure also includes a second dielectric layer formed over the metal layer and the first dielectric layer. The semiconductor structure also includes a first conductive structure formed in the second dielectric layer in contact with the metal layer. A bottom portion of the first conductive structure is surrounded by the protection layer and the second cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first cap layer over a metal layer;
   patterning the metal layer and the first cap layer to form openings exposing a gate structure;
   forming a first dielectric layer in the openings;
   patterning the first cap layer to form a via cap plug over the metal layer;
   forming a second dielectric layer over the via cap plug and the metal layer;
   forming a trench in the second dielectric material to expose the via cap plug;
   removing the via cap plug to enlarge the trench; and
   filling the trench with a conductive material.

2. The method for forming the semiconductor structure as claimed in claim 1, further comprising:
   planarizing the first dielectric layer and the first cap layer to expose the first cap layer.

3. The method for forming the semiconductor structure as claimed in claim 2, further comprising:
   forming a fin structure over a substrate;
   forming the gate structure across the fin structure;
   depositing the metal layer over the gate structure;
   conformally forming a protection layer over the first cap layer, the metal layer, and the gate structure after patterning the metal layer and the first cap layer,
   wherein planarizing the first dielectric layer removes the protection layer over the first cap layer.

4. The method for forming the semiconductor structure as claimed in claim 3, wherein the protection layer remains over the sidewall of the trench after removing the via cap plug.

5. The method for forming the semiconductor structure as claimed in claim 1, further comprising:
   conformally forming a second cap layer over the metal layer, the first dielectric layer, and the via cap plug.

6. The method for forming the semiconductor structure as claimed in claim 1, further comprising:
   rounding a corner of a bottom portion of the trench before filling the trench with the conductive material.

7. The method for forming the semiconductor structure as claimed in claim 1, further comprising:
   forming a third cap layer over the second dielectric layer; and
   forming a hard mask layer over the third cap layer.

8. A method for forming a semiconductor structure, comprising:
   growing a source/drain epitaxial structure over a substrate;
   forming a contact structure over the source/drain epitaxial structure;
   depositing a metal layer over the contact structure;
   depositing a first cap layer over the metal layer;
   forming an opening in the first cap layer and the metal layer;
   filling the opening with a first dielectric layer;
   patterning the first cap layer to form a via cap plug over the metal layer;
   removing the via cap plug over the metal layer; and
   forming a conductive structure over the metal layer.

9. The method for forming the semiconductor structure as claimed in claim 8, further comprising:
   depositing a glue layer over the gate structure and the contact structure before depositing the metal layer.

10. The method for forming the semiconductor structure as claimed in claim 9, further comprising:

removing the glue layer exposed in the opening to expose the gate structure; and conformally forming a protection layer between the first dielectric layer and the gate structure.

11. The method for forming the semiconductor structure as claimed in claim 10, further comprising:

forming a second dielectric layer over the via cap plug and the metal layer;

forming a third cap layer over the second dielectric layer;

forming a hard mask layer over the third cap layer;

etching the protection layer; and removing the hard mask layer and the via cap plug over the metal layer.

12. The method for forming the semiconductor structure as claimed in claim 11, wherein etch selectivity between the second dielectric layer and the first cap layer is in a range of about 0.1 to about 100.

13. The method for forming the semiconductor structure as claimed in claim 8, further comprising:

forming a second cap layer over the via cap plug, wherein the second cap layer and the via cap plug are made of different materials.

14. The method for forming the semiconductor structure as claimed in claim 13, wherein etch selectivity between the second dielectric layer and the second cap layer is in a range of about 0.1 to about 100.

15. A method for forming a semiconductor structure, comprising:

forming a gate structure over a substrate;

forming a source/drain epitaxial structure beside of the gate structure;

forming a contact structure over the source/drain epitaxial structure;

depositing a first metal layer over the contact structure;

patterning the first metal layer to form an opening in the first metal layer;

forming a first dielectric layer in the opening;

forming a via cap plug over the first metal layer;

depositing a second dielectric layer over the first metal layer and the via cap plug;

forming a trench in the second dielectric layer to expose the via cap plug;

removing the via cap plug; and forming a conductive structure in the trench.

16. The method for forming the semiconductor structure as claimed in claim 15, further comprising:

forming a protection layer over a bottom surface and sidewalls of the opening before forming the first dielectric layer, wherein a top surface of the protection layer is exposed in the trench.

17. The method for forming the semiconductor structure as claimed in claim 16, further comprising:

consuming the protection layer after removing the via cap plug.

18. The method for forming the semiconductor structure as claimed in claim 15, further comprising:

depositing a first cap layer over the first metal layer; and planarizing the first dielectric layer to expose the first cap layer, wherein a top surface of the first dielectric layer is lower than a top surface of the first cap layer after planarizing the first dielectric layer.

19. The method for forming the semiconductor structure as claimed in claim 18, wherein forming the via cap plug comprises:

forming and patterning a photoresist layer over the first cap layer, wherein an edge of the photoresist layer is directly above the first dielectric layer.

20. The method for forming the semiconductor structure as claimed in claim 15, wherein a bottom surface of the trench is wider than a top surface of the via cap plug before removing the via cap plug.

* * * * *